(12) United States Patent
Rau et al.

(10) Patent No.: US 9,104,016 B2
(45) Date of Patent: Aug. 11, 2015

(54) OPTICAL PROJECTION SYSTEM

(71) Applicant: Carl Zeiss SMT GmbH, Oberkochen (DE)

(72) Inventors: Johannes Rau, Gerstetten (DE); Armin Schoeppach, Aalen (DE); Bernhard Gellrich, Aalen (DE); Jens Kugler, Aalen (DE); Martin Mahlmann, Heidenheim (DE); Bernhard Geuppert, Aalen (DE); Thomas Petasch, Aalen (DE); Gerhard Fuerter, Ellwangen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 222 days.

(21) Appl. No.: 13/626,810

(22) Filed: Sep. 25, 2012

(65) Prior Publication Data
US 2013/0044304 A1    Feb. 21, 2013

Related U.S. Application Data

(62) Division of application No. 11/664,896, filed as application No. PCT/EP2005/010819 on Oct. 1, 2005, now Pat. No. 8,300,210.

(60) Provisional application No. 60/700,220, filed on Jul. 18, 2005, provisional application No. 60/617,415, filed on Oct. 8, 2004.

(51) Int. Cl.
*G03B 27/54* (2006.01)
*G03B 27/42* (2006.01)
(Continued)

(52) U.S. Cl.
CPC .............. *G02B 17/0892* (2013.01); *G02B 7/00* (2013.01); *G02B 7/008* (2013.01); *G02B 17/08* (2013.01);
(Continued)

(58) Field of Classification Search
CPC    G03F 7/70883; G03F 7/70833; G03F 7/0808
USPC ................................ 355/53, 67; 359/811–820
See application file for complete search history.

(56) References Cited

U.S. PATENT DOCUMENTS 5,638,223 A    6/1997    Ikeda
6,208,408 B1    3/2001    Takabayashi
(Continued)

FOREIGN PATENT DOCUMENTS

CN    2209338 Y    10/1995
CN    1375719    10/2002
(Continued)

OTHER PUBLICATIONS

Chinese Office Action, with English translation, issued in CN 201110126344.3 on Apr. 4, 2014.
(Continued)

*Primary Examiner* — Hung Henry Nguyen
(74) *Attorney, Agent, or Firm* — Fish & Richardson P.C.

(57) ABSTRACT

An optical projection system for a microlithography system includes a light path, a first lens unit receiving a first part of the light path, a second lens unit receiving a second part of the light path, and a support unit supporting the first and second lens units. The first and second lens units are elongated lens units including a plurality of lenses. The support unit includes a housing receiving a third part of the light path and enclosing a reflective element. The housing includes first and second interfaces. The first interface is a first support interface supporting the first lens unit. The second interface is a second support interface supporting the second lens unit at a location substantially opposite to the first interface.

24 Claims, 8 Drawing Sheets

(51) Int. Cl.
*G02B 17/08* (2006.01)
*G02B 7/00* (2006.01)
*G03F 7/20* (2006.01)

(52) U.S. Cl.
CPC ........ *G02B 17/0804* (2013.01); *G02B 17/0812* (2013.01); *G03F 7/70808* (2013.01); *G03F 7/70825* (2013.01); *G03F 7/70833* (2013.01); *G03F 7/70883* (2013.01)

(56) References Cited

U.S. PATENT DOCUMENTS

| | | |
|---|---|---|
| 6,449,106 B1 | 9/2002 | Spinali |
| 6,473,245 B1 | 10/2002 | Spinali |
| 6,529,264 B1 | 3/2003 | Ikeda |
| 6,549,347 B1 | 4/2003 | Spinali |
| 6,631,038 B1 | 10/2003 | Spinali |
| 6,639,740 B1 | 10/2003 | Spinali |
| 6,757,051 B2 | 6/2004 | Takahashi et al. |
| 6,873,476 B2 | 3/2005 | Shafer |
| 7,619,715 B2 * | 11/2009 | Ono et al. ............ 355/53 |
| 8,300,210 B2 | 10/2012 | Rau et al. |
| 2002/0044260 A1 | 4/2002 | Takahashi et al. |
| 2002/0131165 A1 | 9/2002 | Takahama |
| 2002/0149754 A1 | 10/2002 | Auer et al. |
| 2003/0063264 A1 | 4/2003 | Watanabe et al. |
| 2005/0099704 A1 | 5/2005 | Rau et al. |
| 2009/0174874 A1 | 7/2009 | Rau et al. |

FOREIGN PATENT DOCUMENTS

| | | |
|---|---|---|
| CN | 1410830 | 4/2003 |
| CN | 1451989 | 10/2003 |
| CN | 1475828 | 2/2004 |
| DE | 198 30 719 | 2/1999 |
| DE | 103 52 820 | 6/2005 |
| EP | 0323945 | 7/1989 |
| EP | 1 168 028 | 1/2002 |
| EP | 138298 A2 | 1/2004 |
| GB | 2387668 A | 10/2003 |
| JP | 2002-083766 | 3/2002 |
| JP | 2003-109892 | 4/2003 |
| JP | 2003-114387 | 4/2003 |
| JP | 2003-195141 | 7/2003 |
| JP | 2003-337272 | 11/2003 |
| TW | 2004006602 | 5/2005 |
| WO | WO 90/01385 | 2/1990 |
| WO | WO 03/012548 | 2/2003 |
| WO | WO 2004/021419 | 3/2004 |

OTHER PUBLICATIONS

Chinese Office Action, with translation, for corresponding CN Appl No. 201110126344.3, dated Aug. 22, 2013.
International Search Report and a Written Opinion from the counterpart PCT Application No. PCT/EP2005/010819, dated Feb. 24, 2006.
International Preliminary Report on Patentability for corresponding PCT Application No. PCT/EP2005/010819, dated Apr. 11, 2007.
Chinese Office Action, with English translation, issued in CN 201110126344.3 on Dec. 5, 2012.
Japanese Office Action, with English translation, for corresponding JP Appl No. 2011-208150, dated Oct. 16, 2012.

* cited by examiner

OPTICAL PROJECTION SYSTEM

CROSS-REFERENCE TO RELATED APPLICATIONS

This application is a divisional of, and claims priority under 35 USC 120 to, U.S. application Ser. No. 11/664,896, filed Nov. 28, 2008, now U.S. Pat. No. 8,300,210, which is the National Stage of International Application No. PCT/EP05/10819, filed Oct. 1, 2005, which claims the benefit of U.S. Provisional Application Ser. No. 60/617,415 filed Oct. 8, 2004 and 60/700,220 filed Jul. 18, 2005. The contents of these applications are hereby incorporated by reference in its entirety.

This patent disclosure hereby incorporates by reference international Patent Application Serial No. PCT/EP2003/008962 published as WO 2004/034149 on 22 Apr. 2004 and invented by Weber et al.

BACKGROUND OF THE INVENTION

The present invention relates to support units for optical sub-systems, in particular ions units, of microlithography systems. Furthermore, it relates to an optical projection system comprising such a support unit and an optical exposure apparatus comprising such an optical projection system. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical elements, such as lenses and mirrors etc., in the light path of the optical system. Those optical elements usually cooperate in an exposure process to transfer an image formed on a reticle or the like onto a substrate such as a wafer. Said optical elements are usually combined in several functionally distinct optical sub-systems. These distinct optical sub-systems may be formed by distinct lens units comprising a plurality of such optical elements, such as lenses and mirrors and other optical elements, of the optical system. Refractive lens units or at least mainly refractive lens units mostly have a straight axis of symmetry of the optical elements usually referred to as the optical axis. Moreover, they generally have an elongated substantially tubular design due to which they are typically referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture and increased imaging accuracy of the optical system. Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the above optical sub-systems must be supported in a defined manner in order to maintain a predetermined spatial relationship between said optical sub-systems to provide a high quality exposure process.

In many cases, several distinct lens barrels are directly connected to each other to form a mechanical lens barrel unit as it is known, for example, from EP 1 168 028 A2 to Takahashi et al. In these cases, support to the lens barrel unit is provided via a support structure contacting a flange of one of the lens barrels. Often, different lens barrels are supported separately by one or more support structures. In either case the support structures supporting the lens barrels or lens barrel units typically are designed in the manner of an open skeleton framework. Such framework support structures are known, for example, from U.S. Pat. Nos. 5,638,223 and 6,529,264 B1 both to Ikeda as well as from U.S. Pat. Nos. 6,639,740 B1, 6,631,038 B1, 6,549,347 B1, 6,449,106 B1, 6,473,245 B1 all to Spinali.

Those open support structures may allow for an accurate positioning of the lens barrels with respect to each other. However, they show the disadvantage that, depending on the required spatial relationship between the lens barrels, the light path may have to pass open areas outside the lens barrels. For these areas a gas tight and light tight enclosure has to be provided for avoiding adverse effects on the quality of the exposure process. Such an additional enclosure adds to the overall complexity of the system A further disadvantage of the above support structures lies within the fact that local deformations or position variations within single components of the support structure are likely to lead to position variations of the optical elements which largely affect the accuracy of the optical system and, thus, the quality of the exposure process. Furthermore, such variations cause extensive effort for re-adjusting the optical system.

Furthermore, from WO 03/012548 A1 to Kohl et al., it is known to support distinct optical sub-systems of a microlithography system via a support structure in the form of a housing-like frame structure composed of an upper frame structure element and a lower frame structure element. While the lower frame structure element supports a rather heavy elongated refractive optical sub-system in the form of an elongated lens barrel, the upper frame structure element only supports rather lightweight optical sub-systems in the form of axially short lens or lens and mirror groups.

This design may be useful for a microlithography system with only lightweight optical sub-systems located in the light path before any heavy elongated refractive optical sub-system. However, further heavy elongated refractive optical sub-systems located in the light path before said heavy elongated refractive optical sub-system mounted to the lower frame structure element seem to be mounted to open support structures as previously described. This again leads to the above disadvantages.

Furthermore, as it is known e.g. from U.S. Pat. No. 6,873, 476 B2 to Shafer, configurations of optical elements may be used in microlithography systems where certain optical elements have to be arranged off-axis. U.S. Pat. No. 6,873,476 B2 to Shafer discloses a catadioptric microlithography projection unit with a folded optical axis. One of the mirrors used has to be laterally offset from the remaining optical elements resulting in a housing structure that deviates from the cylindrical design of the remaining part of the projection unit. This leads to a very complex design of the projection unit that has considerable disadvantages with respect to its thermal and dynamic properties. Furthermore, peripheral units, such as cooling devices etc., have also to be adapted to this complex design. Finally, assembly and adjustment of the projection unit are rather complicated since simple test methods available for rotationally symmetric units may not be used.

SUMMARY OF THE INVENTION

It is thus an object of the present invention to provide for a support of the optical sub-systems, in particular, the lens units, of an optical projection system of a microlithography system that, at least to some extent, overcomes the above disadvantages.

It is a further object of the present invention to provide for a support of the optical sub-systems, in particular, the lens units, of an optical projection system of a microlithography system which is simple to implement, which is of simple design and which allows for a simple and durable adjustment of the position of said optical sub-systems with respect to each other and with respect to an external reference.

It is a further object of the present invention to provide for an optical projection system of a microlithography system, as well as to provide for a support unit for optical sub-systems of a microlithography system, in particular, the lens units of a microlithography system, as well as to provide for an optical exposure apparatus each of which, at least to some extent, over-comes the above disadvantages.

It is a further object of the present invention to provide for an optical projection system of a microlithography system, as well as to provide for a support unit for optical sub-systems of a microlithography system, in particular, the lens units of a microlithography system, as well as to provide for an optical exposure apparatus each of which is simple to implement, is of simple design and allows for a simple and durable adjustment of the position of said optical sub-systems with respect to each other and with respect to an external reference.

According to the invention it has been found that it is possible to integrate several functions within a single compact optical element module providing good thermal and dynamic properties. On the one hand, the housing of such an optical element module may serve as a load bearing structure supporting several elongated and heavy optical sub-systems or even all optical sub-systems of an optical projection unit. On the other hand, the housing of such an optical element module may be designed in such a manner that it does not break up the external symmetry of the optical projection unit.

Thus, according to one aspect of the invention there is provided an optical projection unit comprising a first optical element module and at least one second optical element module. The first optical element module comprises a first housing unit and at least a first optical element, the first optical element being received within the first housing unit and having an optically used first region defining a first optical axis. The at least one second optical element module is located adjacent to the first optical element module and comprises at least one second optical element, the second optical element defining a second optical axis of the optical projection unit. The first housing unit has a central first housing axis and an outer wall extending in a circumferential direction about the first housing axis. The first optical axis is at least one of laterally offset and inclined with respect to the first housing axis. Furthermore, the first housing axis is substantially collinear with the second optical axis.

According to a further aspect of the invention there is provided an optical exposure apparatus for transferring an image of a pattern formed on a mask onto a substrate comprising a light path, a mask location located within the light path and receiving the mask, a substrate location located at an end of the light path and receiving the substrate, and an optical projection unit according to the invention located within the light path between the mask location and the substrate location.

According to a further aspect of the invention there is provided a method of holding a plurality of optical elements comprising, in a first step, providing the plurality of optical elements and, in a second step, holding the plurality of optical elements relative to each other. The plurality of optical elements comprises a first optical element and at least one second optical element, the first optical element having an optically used first region defining a first optical axis, and the at least one second optical element defining a second optical axis. In the first step, a first housing unit is provided, the first housing unit having a central first housing axis and an outer wall extending in a circumferential direction about the first housing axis. In the second step, the first optical element is held within the first housing unit such that the first optical axis is at least one of laterally offset and inclined with respect to the first housing axis. In the second step, the at least one second optical element is held with respect to the first housing unit such that the second optical axis is substantially collinear with the first housing axis.

With such an optical projection unit, such an optical exposure apparatus and such a method, respectively, it is possible to maintain the external symmetry of an optical projection unit the optical projection unit forms part of. In particular, this is possible despite the asymmetric arrangement of some of the optical elements received within the optical projection unit. Such a design with external symmetry is of a less complexity which, in turn, leads to improved thermal and dynamic properties compared to the known externally asymmetric designs. Furthermore, the complexity of peripheral units, such as cooling devices etc., is also reduced leading to a reduced manufacturing effort. Finally, simple test methods available for rotationally symmetric units may be used with such a design. Thus, assembly and adjustment of the projection unit are less complicated compared to the known externally asymmetric designs.

It will be appreciated that, although the external symmetry of the design according to the invention in some cases requires more building space and larger housing components than known asymmetric designs, it has been found that the advantages outlined above largely outweigh these disadvantages.

According to a further aspect of the present invention there is provided an optical projection system for a microlithography system comprising a light path, a first lens unit receiving a first part of said light path, a second lens unit receiving a second part of said light path, a support unit supporting said first lens unit and said second lens unit, said support unit comprising a housing receiving a third part of said light path, said housing comprising at least a first interface and a second interface, said first interface being a first support interface supporting said first lens unit, said second interface being a second support interface supporting said second lens unit, said first lens unit and said second lens unit being elongated lens units comprising a plurality of lenses.

It has been found that, with such a support unit, it is possible to integrate several functions within a single unit. On the one hand, the housing of said support unit may serve as a load bearing structure supporting several elongated and heavy optical sub-systems or even all optical sub-systems of the optical projection system. Due to its structural coherence, the housing provides a stable single reference for all lens units mounted to it. This considerably reduces the effort for mutual adjustment of the lens units, which, in general, is to be monitored and provided continuously. Furthermore, the housing of said support unit may also integrate the light tight and gas tight enclosure of the light path between separate lens units. This considerably adds to the simplicity of the overall design.

According to a further aspect of the present invention there is provided a support unit for supporting lens units of a microlithography system comprising a housing for partly receiving a light path, said housing comprising at least a first interface and a second interface, said first interface being a first support interface for supporting an elongated first lens unit comprising a plurality of lenses, said second interface being a second support interface for supporting an elongated second lens unit comprising a plurality of lenses, said housing being adapted to substantially bear the load of said elongated first lens unit and said elongated second lens unit.

It will be appreciated that the present invention may not only be used in the context of lens units. It may also be used in the context of supporting optical sub-systems of any design, which may, exclusively or in part, contain optical elements other than refractive optical elements, such as reflective optical elements and/or diffractive optical elements etc.

Thus, according to a further aspect of the present invention there is provided an optical projection system for a microlithography system comprising a light path, a first optical sub-system receiving a first part of said light path, a second optical sub-system receiving a second part of said light path, a support unit supporting said first optical sub-system and said second optical sub-system, said support unit comprising a housing receiving a third part of said light path, said housing comprising at least a first interface and a second interface, said first interface being a first support interface supporting said first optical sub-system, said second interface being a second support interface supporting said second optical sub-system, said first optical sub-system and said second optical sub-system being elongated units comprising a plurality of optical elements.

According to a further aspect of the present invention there is provided an optical projection system for a microlithography system comprising a light path, a first lens unit receiving a first part of said light path, a second lens unit receiving a second part of said light path, a support unit supporting said first lens unit and said second lens unit; said first lens unit and said second lens unit being elongated lens units comprising a plurality of lenses; said support unit comprising a housing receiving a third part of said light path and enclosing at least one reflective element; said housing comprising at least a first interface including a first passage for said light path and a second interface including a second passage for said light path; said housing forming an envelope for said light path, said envelope, apart from said first passage and said second passage, being essentially light tight; said first interface being a first support interface supporting said first lens unit, and said second interface being a second support interface supporting said second lens unit.

According to a further aspect of the present invention there is provided an optical projection system for a microlithography system comprising a light path, a first lens unit receiving a first part of said light path, a second lens unit receiving a second part of said light path, a support unit supporting said first lens unit and said second lens unit; said first lens unit and said second lens unit being elongated lens units comprising a plurality of lenses; said support unit comprising a housing receiving a third part of said light path and enclosing at least one reflective element; said housing comprising at least a first interface and a second interface; said first interface being a first support interface supporting said first lens unit; said second interface being a second support interface supporting said second lens unit at a location substantially opposite to said first interface.

According to a further aspect of the present invention there is provided an optical projection system for a microlithography system comprising a light path, at least two lens unit pairs, a support unit supporting each lens unit pair; each of said lens unit pairs comprising two lens units, each of said lens units receiving a part of said light path; said lens units being elongated lens units comprising a plurality of lenses; said support unit comprising a housing receiving a further part of said light path; said housing comprising at least two interface pairs, each interface pair supporting one of said lens unit pairs; each of said interface pairs comprising two support interfaces arranged substantially opposite to one another, each of said support interfaces supporting one of said lens units of said respective lens unit pair.

According to a further aspect of the present invention there is provided an optical projection system for a microlithography system comprising a light path, a first lens unit receiving a first part of said light path, a second lens unit receiving a second part of said light path, a support unit supporting said first lens unit and said second lens unit; said first lens unit and said second lens unit being elongated lens units comprising a plurality of lenses; said support unit comprising a supporting part supporting said first lens unit and said second lens unit and a separate enveloping part enveloping a third part of said light path.

According to a further aspect of the present invention there is provided an optical projection system for a microlithography system comprising an optical axis, at least a first optical element unit defining a first part of said optical axis, and a support unit supporting said first optical element unit; said support unit comprising a support housing receiving at least one optical element, said at least one optical element defining at least a second part of said optical axis, said support housing having at least a first interface, said first interface being adapted to support and adjust said first optical element unit.

According to a further aspect of the present invention there is provided an optical exposure apparatus for transferring an image of a pattern formed on a mask onto a substrate, comprising an optical projection system according to the present invention.

Further embodiments of the present invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

Figure 1:
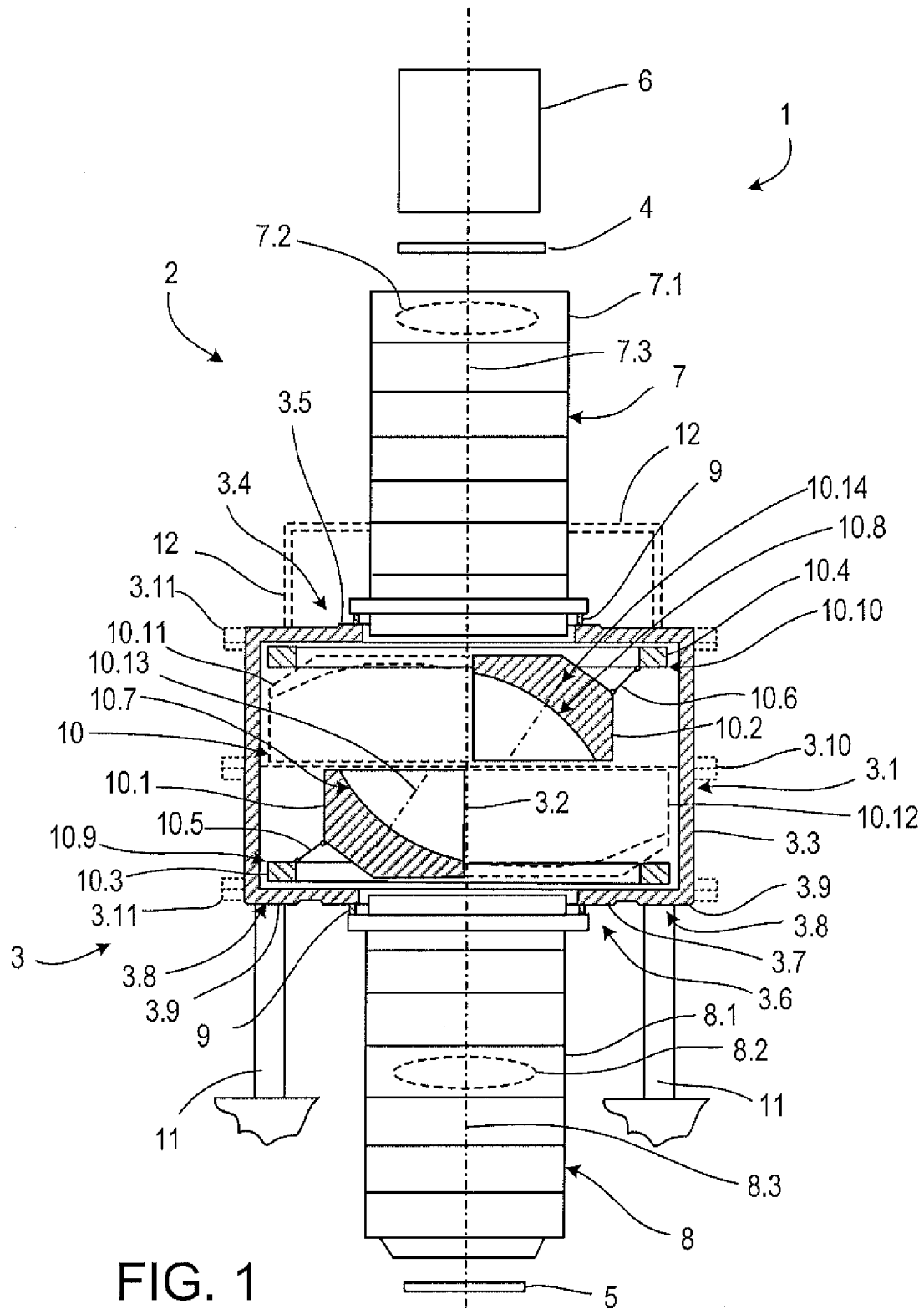
FIG. 1 is a schematic partially sectional view of a preferred embodiment of an optical exposure apparatus according to the present invention comprising an optical projection system according to the present invention with a support unit according to the present invention.

In the following, a first preferred embodiment of an optical exposure apparatus 1 according to the present invention comprising a catadioptric optical projection system 2 according to the present invention with a support unit 3 according to the present invention will be described with reference to FIG. 1.

The optical exposure apparatus 1 is adapted to transfer an image of a pattern formed on a mask 4 onto a substrate 8. To this end, the optical exposure apparatus 5 comprises an illumination system 6 illuminating said mask and the optical projection system 2. The optical projection system 2 projects the image of the pattern formed on the mask 4 onto the substrate 5, e.g. a wafer or the like.

The optical projection unit 2 comprises two optical sub-systems in the form of two elongated optical element units, namely a first optical element unit 7 and a second optical element unit 8 mounted to and supported by the support unit 3. The support unit 3 also forms a first optical element module holding two first optical elements each having a first optical axis as will be described further below.

It will be appreciated that, in the sense of the invention, the term elongated optical element unit is to designate a optical element unit with an optical axis having a dimension along its optical axis which is larger than the dimension of its largest optical element transverse to its optical axis. Such a optical element unit may have a generally cylindrical design with an essentially circular cross section. However, any other type of cross section, such as a polygonal or elliptic cross section may be chosen as well.

The optical projection unit 2 receives the part of the light path between the mask 4 and the substrate 5. In particular, the first optical element unit 7 receives a first part of said light path while the second optical element unit 8 receives a second part of said light path. The support unit 3 receives a third part of said light path located between the first optical element unit 7 and the second optical element unit 8.

Each optical element unit 7, 8 comprises a stack of second optical element modules 7.1 and 8.1, respectively, connected to each other. Each of said second optical element modules 7.1 and 8.1, respectively, comprises one or more second optical elements 7.2 and 8.2, respectively, as well as a support frame supporting said optical element 7.2 and 8.2, respectively.

The second optical elements 7.2 of the first optical element unit define a second optical axis 7.3 as a part of the straight optical axis of the optical projection system 2, while the second optical elements 8.2 of the second optical element unit 8 define a third optical axis 8.3 as a further part of the straight optical axis of the optical projection system 2.

At least some of the second optical elements 7.2 and 8.2, respectively, are actively positioned during operation of the exposure apparatus 6 by means of active positioning devices controlled by a corresponding control device (not shown). To this end, the control device may receive information representative of the actual imaging quality provided by the optical projection system 2 and control the operation of the active positioning devices of the respective second optical element module 7.1 and 8.1, respectively, in response to this information.

The support unit 3 forming the first optical element module comprises a first housing unit 3.1 centrally arranged within the optical projection unit 2. The first housing unit 3.1 has a centrally located first housing axis 3.2 that is collinear with the second optical axes 7.3 and 8.3. The first housing unit 3.1 furthermore has an outer wall 3.3 extending in a circumferential direction about the first housing axis 3.2.

The outer wall 3.3 is substantially rotationally symmetric with respect to the first housing axis 3.2. The outer wall 3.3 has an essentially circular cross section in a plane perpendicular to the first housing axis 3.2. However, it will be appreciated that, with other embodiments of the invention, any other geometry may be chosen that is substantially symmetric with respect to the first housing axis 3.2. It will be appreciated that, in the sense of the invention, the term substantially symmetric with respect to the first housing axis 3.2 is to be understood as including any outer housing geometry that may be transformed substantially into itself by a rotation of less than 360° about the first housing axis.

This first housing unit 3.1 is of sufficient rigidity and strength to take the loads of the first optical element unit 7 and the second optical element unit 8. Furthermore, the housing 3.1 is optically functional. To this end, it forms a gas tight and light tight envelope of the part of the light path between the first optical element unit 7 and the second optical element unit 8. To provide this gas and light tightness, the first optical element unit 7 and the second optical element unit 8, both, are mounted to the housing in as gas and light tight manner via coupling elements 9 as disclosed in the German patent application No. 103 52 820.2, filed on Nov. 11, 2003, the disclosure of which is incorporated herein by reference. These coupling elements 9 also provide for a thermal deformation decoupling of the housing and the respective optical element unit 7, 8. Thus, in other words, the housing unit 3.1 integrates the function of supporting the first optical element unit 7 and the second optical element unit 8 and the function of enveloping said third part of the light path between the latter in a gas tight and light tight manner.

A further optical sub-system 10 forming a reflective part of the catadioptric optical projection system 2 is located within the first housing unit 3.1. This further optical sub-system is formed by two reflective optical elements in the form of mirrors 10.1 and 10.2. These mirrors 10.1 and 10.2 define the shape of the light path within the first housing unit 3.1. Both mirrors 10.1 and 10.2 are mounted radially offset, i.e. laterally offset, with respect to the first housing axis 3.2. Both mirrors 10.1 and 10.2 are mounted are to the first housing unit 3.1 in a statically determinate way, namely in an isostatic manner.

To this end, the mirror 10.1 is mounted to a rotationally symmetric circular ring shaped mirror holder 10.3 having a central holder axis that is substantially collinear with the first housing axis 3.2. Similarly, the mirror 10.2 is mounted to a rotationally symmetric circular ring shaped mirror holder 10.4 having a central holder axis that is substantially collinear with the first housing axis 3.2. For each mirror 10.1 and 10.2 there are provided three suitable mirror supports 10.5 and 10.6, respectively, that are connected to the respective mirror holder 10.3 and 10.4. The mirror supports 10.5 and 10.6 support the respective mirror 10.1 and 10.2 in the region of the optically used first region 10.7 and 10.8, respectively, of the respective mirror 10.1 and 10.2. The mirror holders 10.3 and 10.4 are, in turn, mounted in a statically determinate way to the housing via three evenly distributed suitable housing supports 10.9 and 10.10, respectively. The housing supports 10.9 and 10.10, respectively, are mounted to internal interfaces of the first housing unit 3.1 that are adapted for supporting and adjusting the respective mirror 10.1 and 10.2.

It will be appreciated that, with other embodiments of the present invention, the mirrors may be mounted directly to the first housing unit in a statically determinate way. Furthermore, it will be appreciated that, with other embodiments of the present invention, one or both of the mirrors may be mounted to the housing or a mirror holder in a statically indeterminate way. For example, a statically overdeterminate mounting may be used to introduce defined deformations into the respective mirror.

The symmetric mirror holders 10.3 and 10.4 provide for a largely simplified assembly of the respective mirror 10.1 and 10.2 within the first housing unit 3.1. This is, among others, due to the fact that the mirror holders 10.3 and 10.4 may provide a constant distance to the inner circumference of the outer wall 3.3 allowing the use of identical holder supports evenly distributed at the inner circumference of the outer wall 3.3.

However, it will be appreciated that, with other embodiments of the invention, the respective mirrors 10.1 and 10.2, in their circumferential direction, may extend beyond their optically used first region as it is indicated in FIG. 1 by the dashed contours 10.11 and 10.12, respectively. This allows for an easier and more even support to the mirrors, e.g. the use of support units evenly distributed at the circumference of the respective mirror. Furthermore, such a design may also be beneficial in terms of the dynamic and thermal behavior of the mirrors and their support. Of course, in such cases, the respective mirror may be provided with a recess forming a passageway for the light used during the projection process. Furthermore, in some cases, the mirrors may even be of substantially symmetric shape although only the first region is optically used while a second region is optically unused during the projection process. It has been found that, although such a design causes larger mirrors with large unused areas, in particular the advantages in terms of dynamic and thermal behavior outlined above largely outweigh these disadvantages.

The further optical sub-system 10 forming a reflective part of the catadioptric optical projection system 2 only comprises reflective optical elements. However, it will be appreciated that, with other embodiments of the present invention, the further optical sub-system located within the housing may also comprise other optical elements, e.g. refractive optical elements such as lenses etc. or diffractive optical elements etc.

The optically used first region 10.7 of the mirror 10.1 defines a first optical axis 10.13 that is inclined with respect to the first housing axis 3.2. The same applies to the mirror 10.2, where the optically used first region 10.8 defines a first optical axis 10.14 that is inclined with respect to the first housing axis 3.2. Due to this inclination, the respective mirror 10.1 and 10.2 is laterally offset with respect to the first housing axis 3.2 and, thus, laterally offset with respect to the second optical axes 7.3 and 8.3. In other words, the respective mirror 10.1 and 10.2 is arranged in an off-axis position with respect to the second optical axes 7.3 and 8.3.

The housing 3.1, at its upper side, provides a first interface 3.4 with a simple planar first interface surface 3.5. This first interface 3.4 forms a first support interface for the first optical element unit 7 that has a mating second interface. The first interface 3.4 is adapted for adjusting the first optical element unit 7 with respect to the housing 3.1. The first interface 3.4 also forms a first passage for the light path from the first optical element unit 7 to the support unit 3.

At its lower side, opposite to the upper side with the first interface 3.4, the housing 3.1 provides a third interface 3.6 with a simple planar third interface surface 3.7. This third interface 3.6 forms a third support interface for the second optical element unit 8 that has a mating fourth interface. The third interface 3.7 is adapted for adjusting the second optical element unit 8 with respect to the housing 3.1. The third interface 3.6 also forms a second passage for the light path from the support unit 3 to the second optical element unit 8.

These planar interface surfaces 3.5 and 3.7 are easy to manufacture e.g. by corresponding manufacturing processes such as turning, milling, grinding, polishing etc. or combinations thereof. They add to the overall simplicity of the design.

The first interface surface 3.5 is parallel to the third interface surface 3.7. Furthermore, the second optical axis 7.3 of the first optical element unit 7 and the third optical axis 8.3 of the second optical element unit 8 are adjusted to assume a predetermined positional relationship. This predetermined positional relationship may be any necessary positional relationship, e.g. parallel or inclined with respect to each other. In the embodiment shown, the first optical axis 7.3 of the first optical element unit 7 and the second optical axis 8.3 of the second optical element unit 8 are adjusted to be collinear as a special case of parallelism to define parts of the straight optical axis of the optical projection system 2.

In the embodiment shown, the first interface 3.4 has a first interface axis collinear with the second optical axis 7.3 and with the first housing axis 3.2. Furthermore, the third interface has a second interface axis collinear with the first housing axis 3.2 and the third optical axis 8.3 and, thus, collinear with the first interface axis. However, it will be appreciated that, depending on the required geometry of the light path other alignments of the interface surfaces, the interface axes and the optical axes, respectively, may be provided by simple adjustments of the respective coupling between the optical element unit and the housing.

This arrangement with the second optical axis 7.3 and the third optical axis 8.3 being collinear with the first housing axis 3.2 forming a symmetry axis of the first optical element module 3, despite the off-axis arrangement of the mirrors 10.1 and 10.2, provides for a projection unit 2 that has a substantially rotationally symmetric outer shape over its entire length. In a view along the collinear second optical axes 7.3 and 8.3, the outer shape of the first optical element module 3 is concentric with the outer shape of the optical element units 7 and 8. As has been outline above, this maintained outer symmetry design greatly simplifies the manufacture of the projection unit 2 and provides considerable advantages in terms of dynamic and thermal behavior with respect to known asymmetric designs.

At its lower side, the housing 3.1 furthermore provides auxiliary interfaces 3.8, each with a simple planar auxiliary interface surface 3.9. Each auxiliary interface surface 3.9 forms a rest interface for the support unit 3. At each auxiliary interface 3.9 the support unit 3 and, thus, the optical projection system 2 is coupled to a support element 11 defining the position of the optical projection system 2 in space. Each auxiliary interface surface 3.9 also forms a reference interface for the support unit 3.

The auxiliary interface surfaces 3.9 are separated from but coplanar with the second interface surface 3.7. Thus, all the interface surfaces 3.7 and 3.9 at the lower side of the housing 3.1 may be manufactured in one common step adding to the overall accuracy of the system. To avoid adverse run-on effects during manufacturing affecting the surface quality of the respective interface surface, the surfaces are provided with inclined ramps and/or overruns at their periphery.

It will be appreciated that the above design with coplanar interface surfaces is of particular advantage. However, it will also be appreciated that, with other embodiments of the present invention, other surface configurations may be chosen. Preferably, at least the first and second interface surface forming the support interface for the respective optical element unit protrudes further from the housing than any other part of the housing in order to provide easy access to this surface during its manufacture, e.g. with a large grinding machine etc.

It will be appreciated that further easily accessible external interfaces may be provided at the housing unit 3.1 for arbitrary purposes such as for metrology purposes etc. Furthermore, interfaces may be provided for external supports externally supporting the optical element units as indicated in FIG. 1 by the dashed contours 12.

The housing unit 3.1 is manufactured of a plurality of ceramically bonded sections made of a ceramic material comprising SiC. These sections are prepared in a low shrinkage near-net-shape casting process. Parts of the housing unit 3.1 are then processed, e.g. milled or the like, to provide desired shape. Then, the housing unit 3.1 is ceramized in a low shrinkage near-net-shape reaction infiltration process. Thus, the housing unit 3.1 has a high modulus of elasticity, a high thermal conductivity and a low thermal expansion coefficient. Due to its strength and rigidity, during mounting the optical element units, the housing unit 3.1 may be freely positioned, in particular rotated, in space to provide easy access to the respective areas to be worked on.

The housing unit 3.1 is of monolithic design. However, it will be appreciated that, with other embodiments of the present invention, the housing may be composed of a plurality of separable components, e.g. in two components as it is indicated in FIG. 1 by the dashed contour 3.10. With such an embodiment, the distance between the two mirrors 10.1 and 10.2 may be adjusted by introducing one or more spacer elements between the components of the housing. Furthermore, the housing may be composed of a three separable components as it is indicated in FIG. 1 by the dot-dashed contours 3.11. With such a configuration, the housing may be easily composed of two simple plate-like components and one simple tubular component.

In the following several examples of optical projection systems according to the present invention will be described to explain further preferred arrangements of the optical subsystems of the optical projection system. The components of these optical projection systems, in their design and functionality, correspond to the components of the embodiments described above in the context of FIG. 1. All those optical projection systems are suitable for being applied in an optical exposure apparatus according to the present invention as it has been described above in the context of FIG. 1.

Second Embodiment

Figure 2:
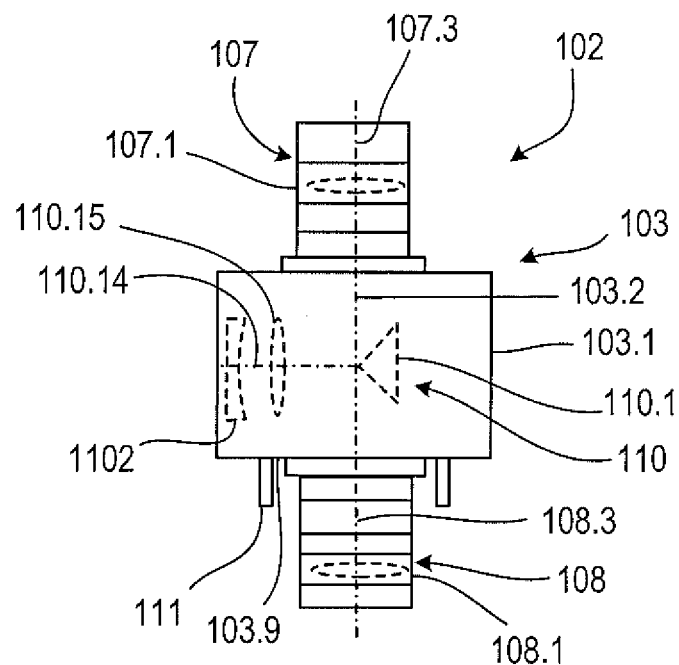
FIG. 2 is a schematic view of a further preferred embodiment of an optical exposure apparatus according to the present invention comprising an optical projection system according to the present invention with a support unit according to the present invention.

FIG. 2 is a schematic view of a second preferred embodiment of a catadioptric optical projection unit 102 according to the present invention with a support unit 103 according to the present invention, the support unit 103 again forming a first optical element module according to the present invention.

The optical projection unit 102 again comprises two refractive optical sub-systems in the form of two elongated optical element units, namely a first optical element unit 107 and a second optical element unit 108 mounted to and supported by the support unit 103 comprising a housing 103.1. The optical element units 107 and 108, again, are composed of a stack of second optical element modules 107.1 and 108.1, respectively.

As with the embodiments described above, each optical element unit 107, 108 comprises a stack of second optical element modules 107.1 and 108.1, respectively, connected to each other. Each of said second optical element modules comprises one or more optical elements as well as a support frame supporting said optical element. The first optical element unit 107 has an optical axis 107.3 defined by its optical elements, while the second optical element unit 108 has an optical axis 108.3 also defined by its optical elements. The optical axis 107.3 is collinear with the optical axis 108.3

The first optical element module 103 comprises a rotationally symmetric first housing unit 103.1 with a central axis of symmetry in the form of a first housing axis 103.2 that is collinear with the optical axes 107.3 and 108.3.

The first optical element module 103 further comprises a catadioptric optical sub-system 110 of the optical projection unit 102. To this end it comprises a plurality of first optical elements in the form of reflecting elements 110.1 and 110.2 and one or more refractive elements 110.15, e.g. lenses. All these first optical elements 110.1, 110.2, 110.15 have optical axes that are inclined with respect to the first housing axis 103.2. In particular, the reflecting element and 110.2 and the refractive element(s) 110.15 have a common first optical axis 110.14 that is perpendicular to the first housing axis 103.2 and, thus, perpendicular to both, the optical axis 107.3 and the optical axis 108.3.

All the first optical elements 110.1, 110.2, 110.15 are mounted to the first housing unit 103.1 by suitable supports in a statically determinate way.

The support unit 103 comprises a steel housing unit 103.1 of sufficient rigidity and strength to take the loads of the first optical element unit 107 and the second optical element unit 108. Each optical element unit 107, 108 is mounted to the housing unit 103.1 via a flange portion located at its innermost optical element module such that the optical element unit 107 and 108, respectively, does substantially not protrude into the housing unit 103.1. Thus, the dimensions of the housing may be kept small reducing the expense for the housing unit 103.1.

Furthermore, the housing unit 103.1 is optically functional. To this end, it forms a gas tight and light tight enclosure of the part of the light path between the first optical element unit 107 and the second optical element unit 108. To provide this gas and light tightness, the optical element units 107 and 108 are mounted to the housing unit in as gas and light tight manner via coupling elements as it has been described above. Thus, in other words, the housing unit 103.1 integrates the function of supporting the optical element units 107 and 108 and the function of enclosing said third part of the light path between the latter in a gas tight and light tight manner.

Furthermore, at its lower side, the housing unit 103.1 provides auxiliary interfaces, each with a simple planar auxiliary interface surface 103.9. Each auxiliary interface surface 103.9 forms a rest interface for the support unit 103. At each auxiliary interface 103.9 the support unit 103 and, thus, the optical projection unit 102 is coupled to a support element 111 defining the position of the optical projection unit 102 in space. Each auxiliary interface surface 103.9 also forms a reference interface for the support unit 103.

Third Embodiment

Figure 3:
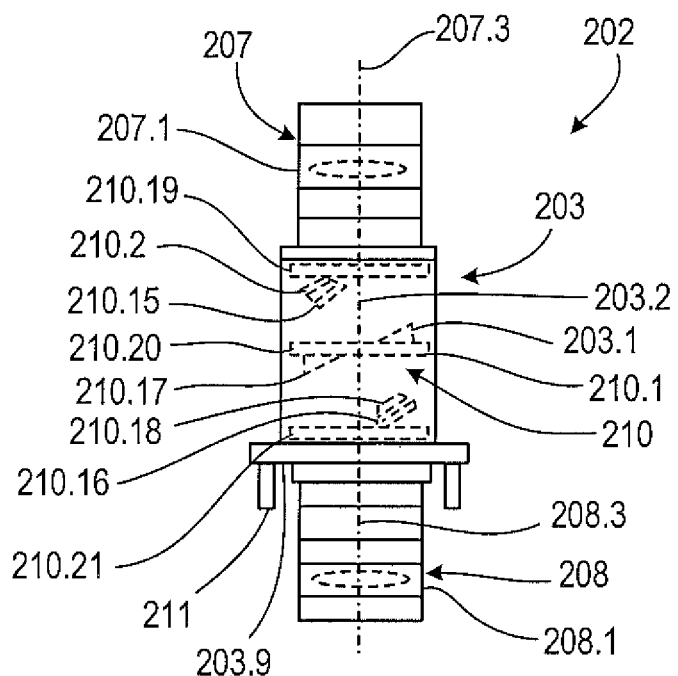
FIG. 3 is a schematic view of a further preferred embodiment of an optical exposure apparatus according to the present invention comprising an optical projection system according to the present invention with a support unit according to the present invention.

FIG. 3 is a schematic view of a third preferred embodiment of a catadioptric optical projection unit 202 according to the present invention with a support unit 203 according to the present invention, the support unit 203 again forming a first optical element module according to the present invention.

The optical projection unit 202 again comprises two refractive optical sub-systems in the form of two elongated optical element units, namely an first optical element unit 207 and a second optical element unit 208 mounted to and supported by the support unit 203 comprising a housing 203.1. The optical element units 207 and 208, again, are composed of a stack of second optical element modules 207.1 and 208.1, respectively.

As with the embodiments described above, each optical element unit 207, 208 comprises a stack of second optical element modules 207.1 and 208.1, respectively, connected to each other. Each of said second optical element modules comprises one or more optical elements as well as a support frame supporting said optical element. The first optical element unit 207 has an optical axis 207.3 defined by its optical elements, while the second optical element unit 208 has an optical axis 208.3 also defined by its optical elements. The optical axis 207.3 is collinear with the optical axis 208.3

The first optical element module 203 comprises a rotationally symmetric first housing unit 203.1 with a central axis of symmetry in the form of a first housing axis 203.2 that is collinear with the optical axes 207.3 and 208.3.

The first optical element module 203 further comprises a catadioptric optical sub-system 210 of the optical projection unit 202. To this end it comprises a plurality of first optical elements in the form of a plurality of reflecting elements 210.1, 210.2, 210.16, 210.17 and a plurality refractive elements 210.15 and 210.18, e.g. lenses. All these first optical elements 210.1, 210.2, 210.15, 210.16, 210.17, 210.18 have optical axes that are inclined with respect to the first housing axis 203.2 and, thus, inclined with respect to both, the optical axis 207.3 and the optical axis 208.3.

All the first optical elements 210.1, 210.2, 210.15, 210.16, 210.17, 210.18 are mounted to the first housing unit 203.1 by suitable supports in a statically determinate way via ring shaped holders 210.19, 210.20, 210.21, respectively, in a manner similar to the one as it has been described above in the context of FIG. 1.

The support unit 203 again comprises a steel housing unit 203.1 of sufficient rigidity and strength to take the loads of the first optical element unit 207 and the second optical element unit 208. Each optical element unit 207, 208 is mounted to the housing unit 203.1 via a flange portion located at its innermost optical element module such that the optical element unit 207 and 208, respectively, does substantially not protrude into the housing unit 203.1. Thus, the dimensions of the housing may be kept small reducing the expense for the housing unit 203.1.

The housing unit 203.1, according to the invention, is arranged such that its outer shape, despite the off-axis arrangement of the first optical elements 210.1, 210.2, 210.15, 210.16, 210.17, 210.18, is substantially flush with the outer shape of the optical element units 207 and 208. Thus, a very compact symmetrical design with advantageous thermal and dynamic behavior is achieved.

Furthermore, the housing unit 203.1 is optically functional. To this end, it forms a gas tight and light tight enclosure of the part of the light path between the first optical element unit 207 and the second optical element unit 208. To provide this gas and light tightness, the optical element units 207 and 208 are mounted to the housing unit in as gas and light tight manner via coupling elements as it has been described above. Thus, in other words, the housing unit 203.1 integrates the function of supporting the optical element units 207 and 208 and the function of enclosing said third part of the light path between the latter in a gas tight and light tight manner.

Furthermore, at its lower side, the housing unit 203.1 has a radially protruding rotationally symmetric flange portion that provides auxiliary interfaces, each with a simple planar auxiliary interface surface 203.9. Each auxiliary interface surface 203.9 forms a rest interface for the support unit 203. At each auxiliary interface 203.9 the support unit 203 and, thus, the optical projection unit 202 is coupled to a support element 211 defining the position of the optical projection unit 202 in space. Each auxiliary interface surface 203.9 also forms a reference interface for the support unit 203.

Fourth Embodiment

Figure 4:
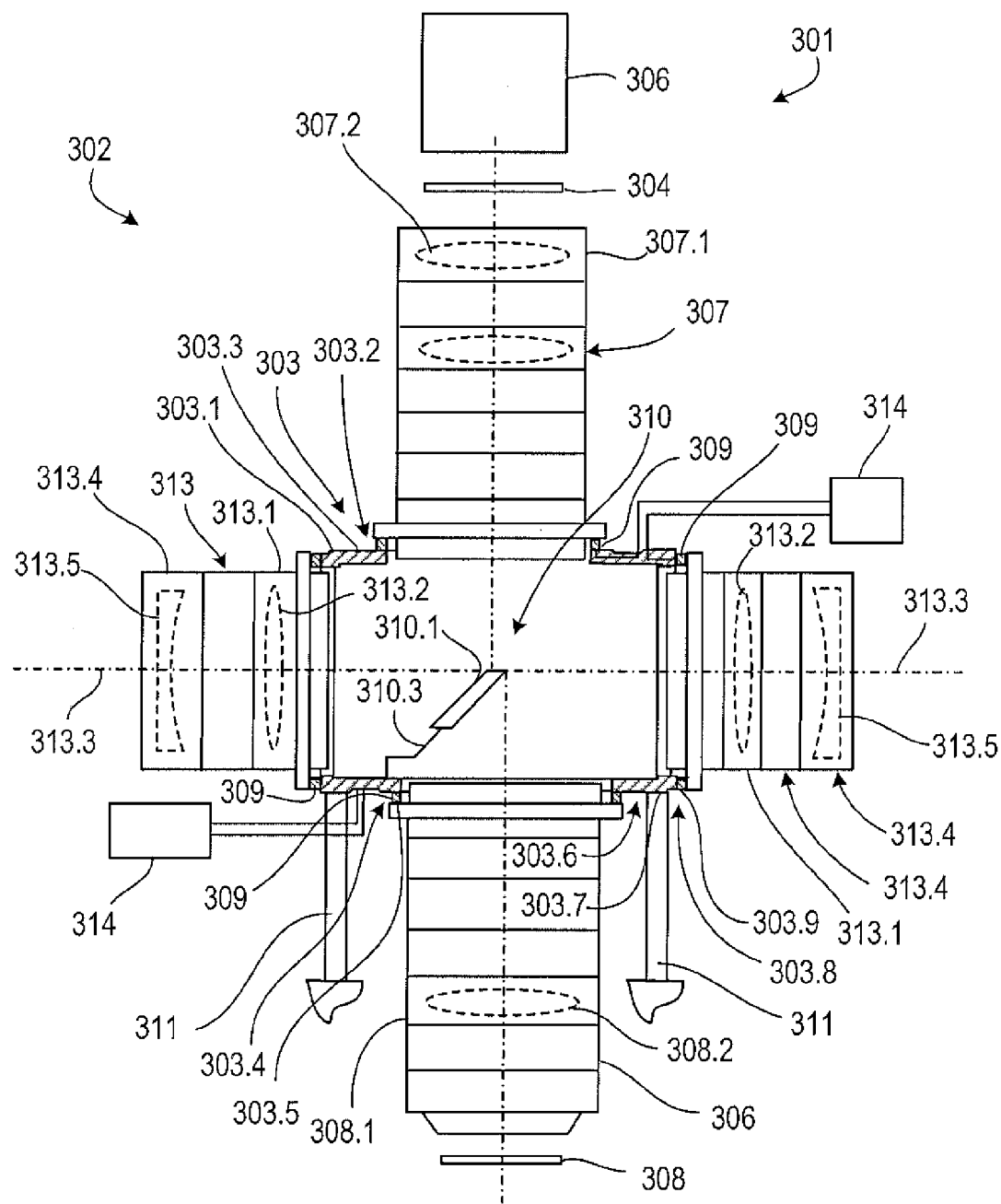
FIG. 4 is a schematic partially sectional view of a further preferred embodiment of an optical projection system according to the present invention with a support unit according to the present invention.

In the following, a fourth preferred embodiment of an optical exposure apparatus 301 according to the present invention comprising a catadioptric optical projection system 302 according to the present invention with a support unit 303 according to the present invention will be described with reference to FIG. 4. In its basic design and functionality, this second embodiment does not differ from the embodiment described with reference to FIG. 1.

The optical exposure apparatus 301 is adapted to transfer an image of a pattern formed on a mask 304 onto a substrate 308. To this end, the optical exposure apparatus 305 comprises an illumination system 306 illuminating said mask and the optical projection system 302. The optical projection system 302 projects the image of the pattern formed on the mask 304 onto the substrate 305, e.g. a wafer or the like.

The optical projection system 302 comprises four optical sub-systems in the form of four lens units, namely a first lens unit 307, a second lens unit 308 and two third lens units 313 mounted to and supported by the support unit 303. The first lens unit 307 and the second lens unit 308 form a first lens unit pair, while the two third lens units 313 form an second lens unit pair. The optical projection system 302, again, receives the part of the light path between the mask 304 and the substrate 305.

Each lens unit 307, 308 and 313 comprises a stack of lens modules 307.1, 308.1 and 313.1, 313.4, respectively, connected to each other. Each of said lens modules 307.1, 308.1 and 313.1, respectively, comprises a lens 307.2, 308.2 and 313.2, respectively, as well as a support frame supporting said lens 307.2, 308.2 and 313.2, respectively. The first lens unit has a first optical axis 307.3, while the second lens unit 308 has a second optical axis 308.3. The third lens modules 313.1 have third optical axes 313.3. The third lens modules 313.4 at the outer end of the respective lens unit 313 further comprise a reflective element 313.5.

At least some of the lenses 307.2, 308.2 and 313.2 as well as the reflective elements 313.5, respectively, are actively positioned during operation of the exposure apparatus 306 by means of active positioning devices controlled by a corresponding control device (not shown). To this end, the control device may receive information representative of the actual imaging quality provided by the optical projection system 302 and control the operation of the active positioning devices of the respective lens module 307.1, 308.1 and 313.2 as well as the reflective elements 313.5, respectively, in response to this information.

The support unit 303 comprises a housing 303.1 of sufficient rigidity and strength to take the loads of the first lens unit 307, the second lens unit 308 and the third lens units 313. Furthermore, the housing 303.1 is optically functional. To this end, it forms a gas tight and light tight enclosure of the part of the light path between the first lens unit 307 and the second lens unit 308. To provide this gas and light tightness, the first lens unit 307, the second lens unit 308 and the third lens units 313 all are mounted to the housing in as gas and light tight manner via coupling elements 309 as disclosed in the German patent application No. 103 52 820.2, filed on Nov. 11, 2003, the disclosure of which is incorporated herein by reference. These coupling elements 309 also provide for a thermal deformation decoupling of the housing and the respective lens unit 307, 308 and 313. Thus, in other words, the housing 303.1 integrates the function of supporting the first lens unit 307 and the second lens unit 308 and the function of enclosing the light path between the latter in a gas tight and light tight manner.

A further optical sub-system 310 of the catadioptric optical projection system 302 is located within the housing 303.1. This further optical sub-system is formed by a prism 310.1. This prism 310.1 is mounted to the housing 303.1 by three suitable supports 310.3 in a statically determinate way, namely in an isostatic manner. It will be appreciated that, with other embodiments of the present invention, the beam splitter may be mounted to a frame which is, in turn, mounted in a statically determinate way to the housing.

The housing 303.1, at its upper side, provides a first interface 303.2 with a simple planar first interface surface 303.3. This first interface 303.2 forms a first support interface for the first lens unit 307. At its lower side, the housing 303.1 provides a second interface 303.4 with a simple planar second interface surface 303.5. This second interface 303.4 forms a second support interface for the second lens unit 308. The housing 303.1, at opposite vertical sides, provides third interfaces 303.8 with a simple planar third interface surface 303.9. Each third interface 303.8 forms a third support interface for one of the third lens units 313. These planar interface surfaces 303.3, 303.5 and 303.9 are easy to manufacture e.g. by corresponding manufacturing processes such as turning, milling, grinding, polishing etc. or combinations thereof. They add to the overall simplicity of the design.

The first interface surface 303.3 is parallel to the second interface surface 303.5. Furthermore, the first optical axis 307.3 of the first lens unit 307 and the second optical axis 308.3 of the second lens unit 308 are adjusted to be transversely offset and parallel to a first direction. In the embodiment shown, the first interface has a first interface axis collinear with the first optical axis 307.3. Furthermore, the second interface has a second interface axis collinear with the second optical axis 308.3 and, thus, transversely offset and parallel to the first interface axis. The third optical axes 313.3 of the third lens units 313 are collinear and parallel to a second direction.

The respective first interface surface 303.3 is perpendicular to the third interface surface 303.9. Furthermore, the first direction extends transversely to the second direction. In particular, the first direction is substantially perpendicular to the second direction. Thus, the first optical axis 307.3 of the first lens unit 307 and the third optical axis 313.3 of the third lens unit 313 are adjusted to be substantially perpendicular. In the embodiment shown, the first interface has a first interface axis collinear with the first optical axis 307.3. Furthermore, the third interface has a third interface axis collinear with the third optical axis 313.3 and, thus, perpendicular to the first interface axis.

However, it will be appreciated that, depending on the required geometry of the light path other alignments of the interface surfaces, the interface axes and the optical axes, respectively, may be provided by simple adjustments of the respective coupling between the lens unit and the housing.

At its lower side, the housing 303.1 furthermore provides two auxiliary interfaces 303.6, each with a simple planar auxiliary interface surface 303.7. Each auxiliary interface surface 303.7 forms a rest interface for the support unit 303. At each auxiliary interface 303.7 the support unit 303 and, thus, the optical projection system 302 is coupled to a support element 311 defining the position of the optical projection system 302 in space. Each auxiliary interface surface 303.7 also forms a reference interface for the support unit 303.

The auxiliary interface surfaces 303.7 are separated from but coplanar with the second interface surface 303.5. Thus, all the interface surfaces 303.5 and 303.7 at the lower side of the housing 303.1 may be manufactured in one common step adding to the overall accuracy of the system. To avoid adverse run-on effects during manufacturing affecting the surface quality of the respective interface surface, the surfaces are provided with inclined ramps at their periphery.

It will be appreciated that the above design with coplanar interface surfaces is of particular advantage. However, it will also be appreciated that, with other embodiments of the present invention, other surface configurations may be chosen. Preferably, at least the first and second interface surface forming the support interface for the respective lens unit protrudes further from the housing than any other part of the housing in order to provide easy access to this surface during its manufacture, e.g. with a large grinding machine etc.

It will be appreciated that further easily accessible external interfaces may be provided at the housing 303.1 for arbitrary purposes such as for metrology purposes etc. Furthermore, interfaces may be provided for external supports externally supporting the lens units.

The housing 303.1 is a monolithic housing made of a ceramic material comprising SiC. The housing 303.1 is prepared in a low shrinkage near-net-shape casting process. Parts of the housing 303.1 are then processed, e.g. milled or the like, to provide the desired shape. The housing 303.1 is then ceramized in a low shrinkage near-net-shape reaction infiltration process. Thus, the housing 303.1 has a high modulus of elasticity, a high thermal conductivity and a low thermal expansion coefficient.

Due to its strength and rigidity, during mounting the lens units, the housing 303.1 may be freely positioned, in particular rotated, in space to provide easy access to the respective areas to be worked on. To provide easy positioning of the respective lens unit during the process of mounting it to the housing 303.1, the respective interface 303.2, 303.4 and 303.8 has an air bearing unit which may be connected to a source 314 of pressurized air or the like.

In the foregoing, the present invention has been described in the context of two embodiments having two and four lens units, respectively. However, it will be appreciated that other variants of the invention may comprise another number of lens units supported by the support unit.

In the following several examples of optical projection systems according to the present invention will be described to explain further preferred arrangements of the optical sub-systems of the optical projection system. The components of these optical projection systems, in their design and functionality, correspond to the components of the embodiments described above in the context of FIGS. 1 and 4. All those optical projection systems are suitable for being applied in an optical exposure apparatus according to the present invention as it has been described above in the context of FIGS. 1 and 4.

Fifth Embodiment

Figure 5:
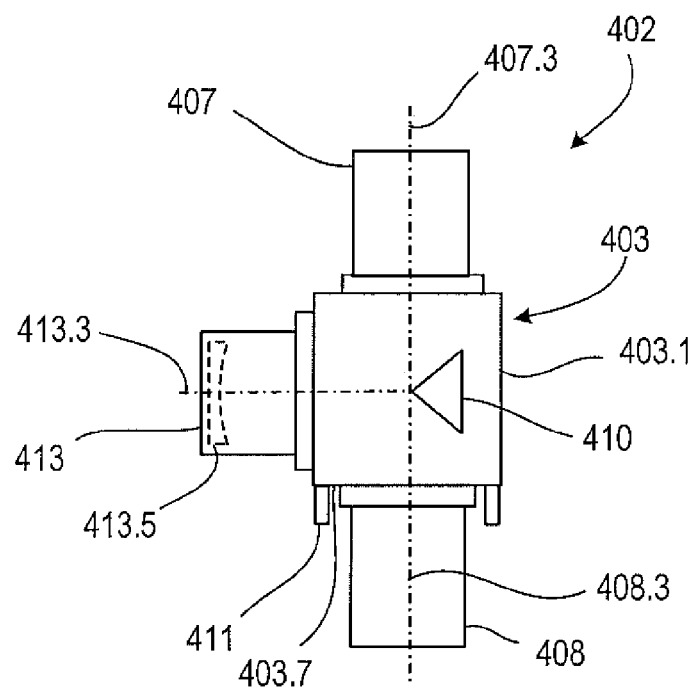
FIG. 5 is a schematic partially sectional view of a further preferred embodiment of a catadioptric optical projection system according to the present invention with a support unit according to the present invention.

FIG. 5 is a schematic partially sectional view of a further preferred embodiment of a catadioptric optical projection system 402 according to the present invention with a support unit 403 according to the present invention.

The optical projection system 402 comprises two refractive optical sub-systems in the form of two elongated lens units, namely a first lens unit in the form of a first lens unit 407 and a second lens unit in the form of a second lens unit 408 mounted to and supported by the support unit 403 comprising a housing 403.1. The optical projection system 402 further comprises a third optical sub-system, namely a third lens unit in the form of a third lens unit 413.

A fourth optical sub-system 410 forming a reflective part of the catadioptric optical projection system 402 is located within the housing 403.1. This further optical sub-system is formed by a reflective element in the form a prism 410. The prism 410 defines the shape of the light path within the housing 403.1. It is mounted to the housing 403.1 by suitable supports in a statically determinate way.

As with the embodiments described above, each lens unit 407, 408, 413 comprises a stack of lens modules connected to each other. Each of said lens modules comprises a lens as well as a support frame supporting said lens. The third lens unit 413 at its outer end further comprises a reflective element 413.5. The first lens unit 407 has a first optical axis 407.3, while the second lens unit 408 has a second optical axis 408.3 and the third lens unit 413 has a third optical axis 413.3. The first optical axis 407.3 is collinear with the second optical axis 408.3, while the third optical axis 413.3 is perpendicular to both, the first optical axis 407.3 and the second optical axis 408.3.

The support unit 403 comprises a steel housing 403.1 of sufficient rigidity and strength to take the loads of the first lens unit 407, the second lens unit 408 and the third lens unit 413. Each lens unit 407, 408 and 413 is mounted to the housing 403.1 via a flange portion located at its innermost lens module such that the lens unit 407, 408 and 413, respectively, does substantially not protrude into the housing 403.1. Thus, the dimensions of the housing may be kept small reducing the expense for the housing 403.1.

Furthermore, the housing 403.1 is optically functional. To this end, it forms a gas tight and light tight enclosure of the part of the light path between the first lens unit 407 and the second lens unit 408. To provide this gas and light tightness, the lens units 407, 408 and 413 are mounted to the housing in as gas and light tight manner via coupling elements as it has been described above. Thus, in other words, the housing 403.1 integrates the function of supporting the lens units 407, 408 and 413 and the function of enclosing said third part of the light path between the latter in a gas tight and light tight manner.

Furthermore, at its lower side, the housing 403.1 provides auxiliary interfaces, each with a simple planar auxiliary interface surface 403.7. Each auxiliary interface surface 403.7 forms a rest interface for the support unit 403. At each auxiliary interface 403.7 the support unit 403 and, thus, the optical projection system 402 is coupled to a support element 411 defining the position of the optical projection system 402 in space. Each auxiliary interface surface 403.7 also forms a reference interface for the support unit 403.

Sixth Embodiment

Figure 6:
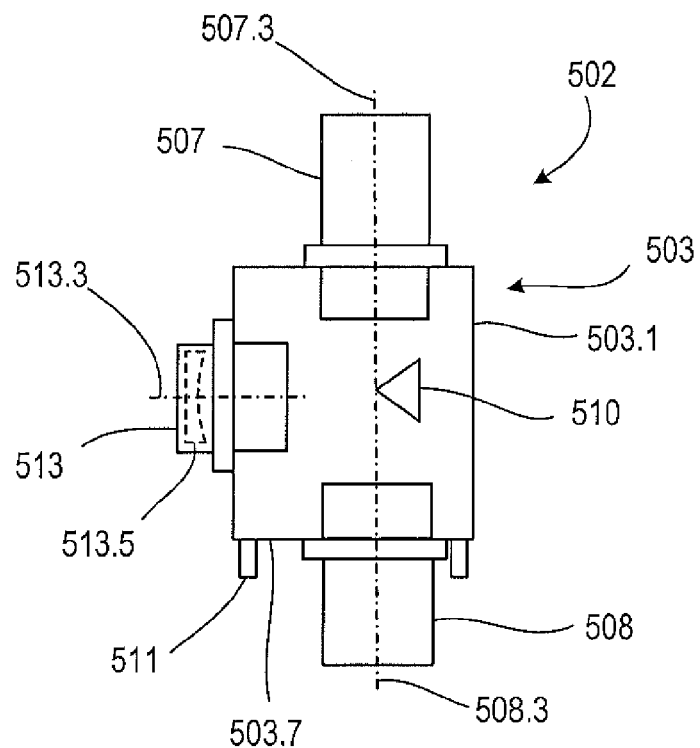
FIG. 6 is a schematic partially sectional view of a further preferred embodiment of an optical projection system according to the present invention with a support unit according to the present invention.

FIG. 6 is a schematic partially sectional view of a further preferred embodiment of a catadioptric optical projection system 502 according to the present invention with a support unit 503 according to the present invention. This embodiment largely corresponds to the embodiment of FIG. 5. Thus, like components have been designated with it the same reference numerals added by a dash and it is here mainly referred to the differences only.

A main difference lies within the connection of the lens units 507, 508 and 513 to the housing 503.1. Each lens unit 507, 508 and 513 is mounted to the housing 503.1 via a flange portion located at a more central lens module of the lens unit 507, 508 and 513, respectively. Thus, the lens unit 507, 508 and 513, respectively, protrudes into the housing 503.1. Although the dimensions of the housing 503.1 increase compared to the housing 503.1 of FIG. 5, this configuration has advantages with respect to the vibration behavior of the optical projection system 502. Thus, external supports 12, as described in the context of FIG. 1, may be avoided.

Seventh Embodiment

Figure 7:
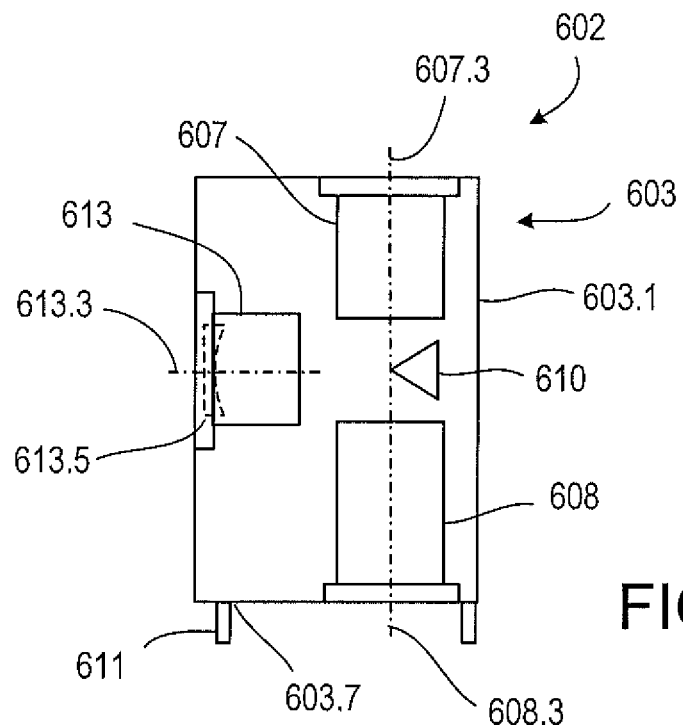
FIG. 7 is a schematic partially sectional view of a further preferred embodiment of an optical projection system according to the present invention with a support unit according to the present invention.

FIG. 7 is a schematic partially sectional view of a further preferred embodiment of a catadioptric optical projection system 602 according to the present invention with a support unit 603 according to the present invention. This embodiment largely corresponds to the embodiment of FIG. 5. Thus, like components have been designated with it the same reference numerals added by two dashes and it is here mainly referred to the differences only.

A main difference lies within the connection of the lens units 607, 608 and 613 to the housing 603.1 and the size of the housing 603.1. Each lens unit 607, 608 and 613 is mounted to the housing 603.1 via a flange portion located at the lens module at the outward end of the lens unit 607, 608 and 613, respectively. Thus, the lens unit 607, 608 and 613, respectively, substantially extends within the housing 603.1. Although the dimensions of the housing 603.1 considerably increase compared to the housing 603.1 of FIG. 5, this configuration has the advantage that the lens units 607, 608 and 613 are protected from external influences by the housing 603.1. In particular, certain given or preferred environmental conditions for the optical projection system 602 may easily be maintained within the housing 603.1.

Eighth Embodiment

Figure 8:
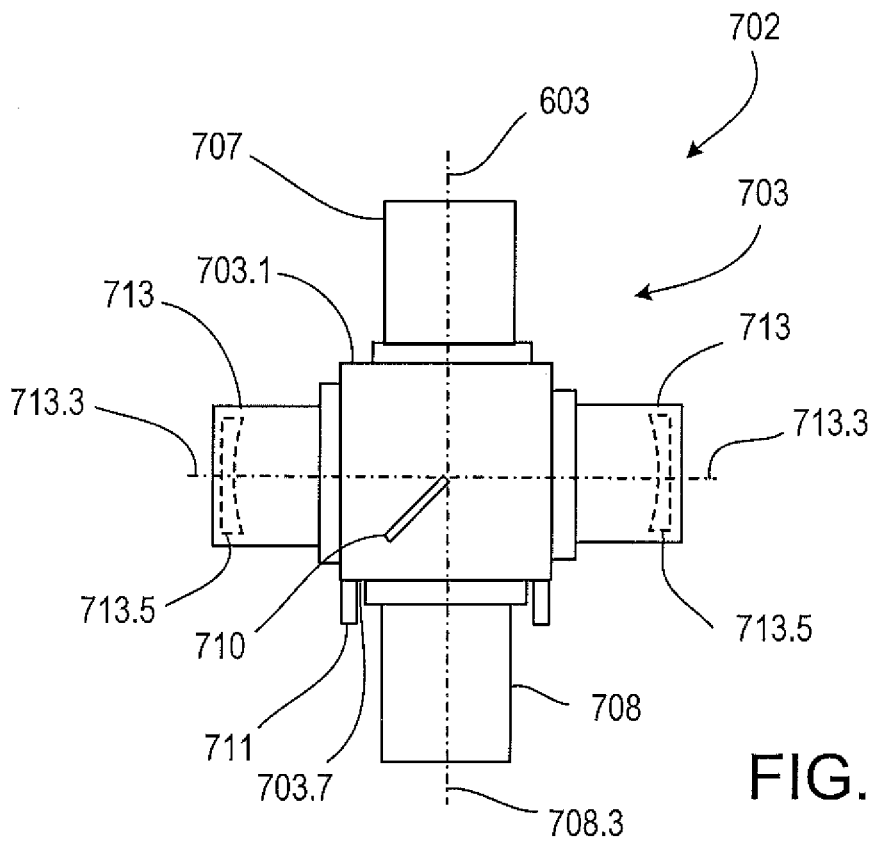
FIG. 8 is a schematic partially sectional view of a further preferred embodiment of an optical projection system according to the present invention with a support unit according to the present invention.

FIG. 8 is a schematic partially sectional view of a further preferred embodiment of a catadioptric optical projection system 702 according to the present invention with a support unit 703 according to the present invention.

The optical projection system 702 comprises two refractive optical sub-systems in the form of two elongated lens units, namely a first lens unit in the form of a first lens unit 707 and a second lens unit in the form of a second lens unit 708 mounted to and supported by the support unit 703 comprising a housing 703.1. The optical projection system 702 further comprises two third optical sub-systems, namely two third lens units in the form of two third lens units 713.

A fourth optical sub-system 710 forming a reflective part of the catadioptric optical projection system 702 is located within the housing 703.1. This further optical sub-system is formed by a reflective element in the form a double sided mirror 710. The mirror 710 defines the shape of the light path within the housing 703.1. It is mounted to the housing 703.1 by suitable supports in a statically determinate way.

As with the embodiments described above, each lens unit 707, 708, 713 comprises a stack of lens modules connected to each other. Each of said lens modules comprises a lens as well as a support frame supporting said lens. The third lens units 713 at their outer end further comprise a reflective element 713.5. The first lens unit 707 has a first optical axis 707.3, while the second lens unit 708 has a second optical axis 708.3 and each third lens unit 713 has a third optical axis 713.3. The first optical axis 707.3 is collinear with the second optical axis 708.3, while the third optical axes 713.3 are collinear with each other but perpendicular to both, the first optical axis 707.3 and the second optical axis 708.3.

The support unit 703 comprises a steel housing 703.1 of sufficient rigidity and strength to take the loads of the first lens unit 707, the second lens unit 708 and the third lens unit 713. Each lens unit 707, 708 and 713 is mounted to the housing 703.1 via a flange portion located at its innermost lens module such that the lens unit 707, 708 and 713, respectively, does substantially not protrude into the housing 703.1. Thus, the dimensions of the housing may be kept small reducing the expense for the housing 703.1.

Furthermore, the housing 703.1 is optically functional. To this end, it forms a gas tight and light tight enclosure of the part of the light path between the first lens unit 707 and the second lens unit 708. To provide this gas and light tightness, the lens units 707, 708 and 713 are mounted to the housing in as gas and light tight manner via coupling elements as it has been described above. Thus, in other words, the housing 703.1 integrates the function of supporting the lens units 707, 708 and 713 and the function of enclosing said third part of the light path between the latter in a gas tight and light tight manner.

Furthermore, at its lower side, the housing 703.1 provides auxiliary interfaces, each with a simple planar auxiliary interface surface 703.7. Each auxiliary interface surface 703.7 forms a rest interface for the support unit 703. At each auxiliary interface 703.7 the support unit 703 and, thus, the optical projection system 702 is coupled to a support element 711 defining the position of the optical projection system 702 in space. Each auxiliary interface surface 703.7 also forms a reference interface for the support unit 703.

Ninth Embodiment

Figure 9:
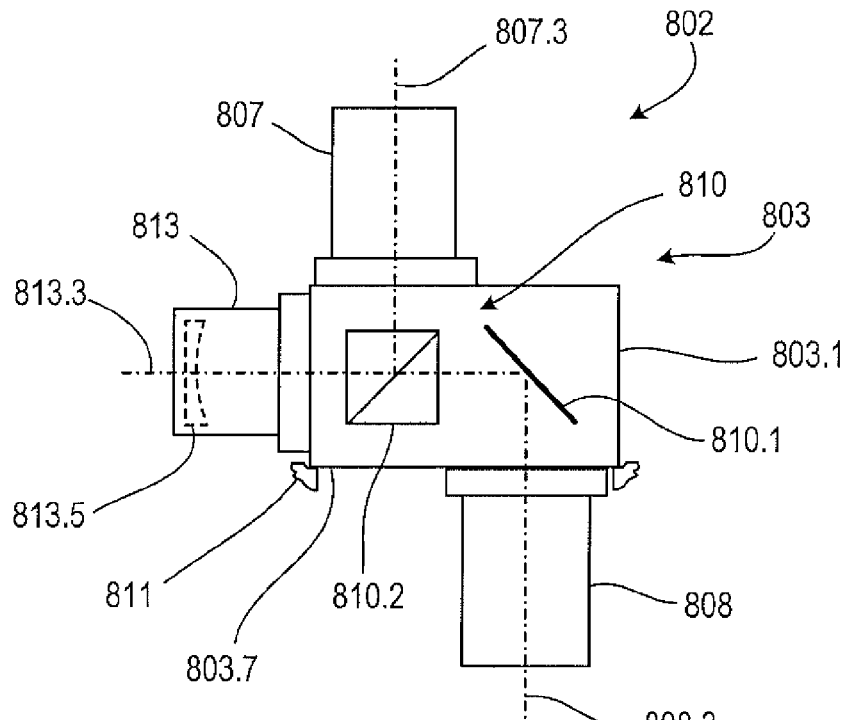
FIG. 9 is a schematic partially sectional view of a further preferred embodiment of an optical projection system according to the present invention with a support unit according to the present invention.

FIG. 9 is a schematic partially sectional view of a further preferred embodiment of a catadioptric optical projection system 802 according to the present invention with a support unit 803 according to the present invention.

The optical projection system 802 comprises two refractive optical sub-systems in the form of two elongated lens units, namely a first lens unit in the form of a first lens unit 807 and a second lens unit in the form of a second lens unit 808 mounted to and supported by the support unit 803 comprising a housing 803.1. The optical projection system 802 further comprises a third optical sub-system, namely a third lens unit in the form of a third lens unit 813.

A fourth optical sub-system 810 forming a reflective part of the catadioptric optical projection system 802 is located within the housing 803.1. This further optical sub-system comprises a reflective element in the form of a mirror 810.1 and a beam splitter 810.2. The mirror 810.1 and the beam splitter 810.2 define the shape of the light path within the housing 803.1. They are mounted to the housing 803.1 by suitable supports in a statically determinate way.

As with the embodiments described above, each lens unit 807, 808, 813 comprises a stack of lens modules connected to each other. Each of said lens modules comprises a lens as well as a support frame supporting said lens. The third lens unit 813 at its outer end further comprises a reflective element 813.5. The first lens unit 807 has a first optical axis 807.3, while the second lens unit 808 has a second optical axis 808.3 and the third lens unit 813 has a third optical axis 813.3. The first optical axis 807.3 is parallel and transversely offset to the second optical axis 808.3, while the third optical axis 813.3 is perpendicular to both, the first optical axis 807.3 and the second optical axis 808.3.

The support unit 803 comprises a ceramic housing 803.1 of sufficient rigidity and strength to take the loads of the first lens unit 807, the second lens unit 808 and the third lens unit 813. Each lens unit 807, 808 and 813 is mounted to the housing 803.1 via a flange portion located at its innermost lens module such that the lens unit 807, 808 and 813, respectively, does substantially not protrude into the housing 803.1. Thus, the dimensions of the housing may be kept small reducing the expense for the housing 803.1.

Furthermore, the housing 803.1 again is optically functional. To this end, it forms a gas tight and light tight enclosure of the part of the light path between the first lens unit 807 and the second lens unit 808. To provide this gas and light tightness, the lens units 807, 808 and 813 are mounted to the housing in as gas and light tight manner via coupling elements as it has been described above. Thus, in other words, the housing 803.1 integrates the function of supporting the lens units 807, 808 and 813 and the function of enclosing said third part of the light path between the latter in a gas tight and light tight manner.

Furthermore, at its lower side, the housing 803.1 provides auxiliary interfaces, each with a simple planar auxiliary interface surface 803.7. Each auxiliary interface surface 803.7 forms a rest interface for the support unit 803. At each auxiliary interface 803.7 the support unit 803 and, thus, the optical projection system 802 is coupled to a support element 811 defining the position of the optical projection system 802 in space. Each auxiliary interface surface 803.7 also forms a reference interface for the support unit 803.

Tenth Embodiment

Figure 10:
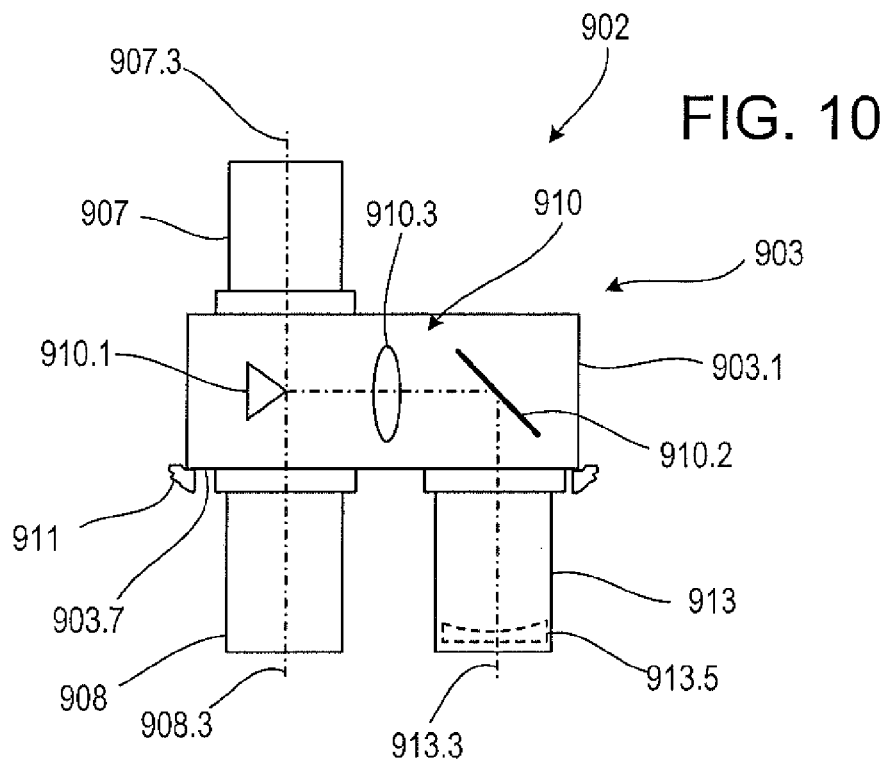
FIG. 10 is a schematic partially sectional view of a further preferred embodiment of an optical projection system according to the present invention with a support unit according to the present invention.

FIG. 10 is a schematic partially sectional view of a further preferred embodiment of a catadioptric optical projection system 902 according to the present invention with a support unit 903 according to the present invention.

The optical projection system 902 comprises two refractive optical sub-systems in the form of two elongated lens units, namely a first lens unit in the form of a first lens unit 907 and a second lens unit in the form of a second lens unit 908 mounted to and supported by the support unit 903 comprising a housing 903.1. The optical projection system 902 further comprises a third optical sub-system, namely a third lens unit in the form of a third lens unit 913.

A fourth optical sub-system 910 forming a reflective part of the catadioptric optical projection system 902 is located within the housing 903.1. This further optical sub-system comprises two reflective optical elements in the form of a prism 910.1 and a mirror 910.2 as well as a refractive optical element in the form of a lens or lens group 910.3. The prism 910.1, the mirror 910.2 and the lens or lens group 910.3 define the shape of the light path within the housing 903.1. They are mounted to the housing 903.1 by suitable supports in a statically determinate way.

As with the embodiments described above, each lens unit 907, 908, 913 comprises a stack of lens modules connected to each other. Each of said lens modules comprises a lens as well as a support frame supporting said lens. The third lens unit 913 at its outer end further comprises a reflective element

913.5. The first lens unit 907 has a first optical axis 907.3, while the second lens unit 908 has a second optical axis 908.3 and the third lens unit 913 has a third optical axis 913.3. The first optical axis 907.3 is collinear with the second optical axis 908.3, while the third optical axis 913.3 is parallel and transversely offset to both, the first optical axis 907.3 and the second optical axis 908.3.

The support unit 903 comprises a steel housing 903.1 of sufficient rigidity and strength to take the loads of the first lens unit 907, the second lens unit 908 and the third lens unit 913. Each lens unit 907, 908 and 913 is mounted to the housing 903.1 via a flange portion located at its innermost lens module such that the lens unit 907, 908 and 913, respectively, does substantially not protrude into the housing 903.1. Thus, the dimensions of the housing may be kept small reducing the expense for the housing 903.1.

Furthermore, the housing 903.1 again is optically functional. To this end, it forms a gas tight and light tight enclosure of the part of the light path between the first lens unit 907 and the second lens unit 908. To provide this gas and light tightness, the lens units 907, 908 and 913 are mounted to the housing in as gas and light tight manner via coupling elements as it has been described above. Thus, in other words, the housing 903.1 integrates the function of supporting the lens units 907, 908 and 913 and the function of enclosing said third part of the light path between the latter in a gas tight and light tight manner.

Furthermore, at its lower side, the housing 903.1 provides auxiliary interfaces, each with a simple planar auxiliary interface surface 903.7. Each auxiliary interface surface 903.7 forms a rest interface for the support unit 903. At each auxiliary interface 903.7 the support unit 903 and, thus, the optical projection system 902 is coupled to a support element 911 defining the position of the optical projection system 902 in space. Each auxiliary interface surface 903.7 also forms a reference interface for the support unit 903.

Eleventh Embodiment

Figure 11:
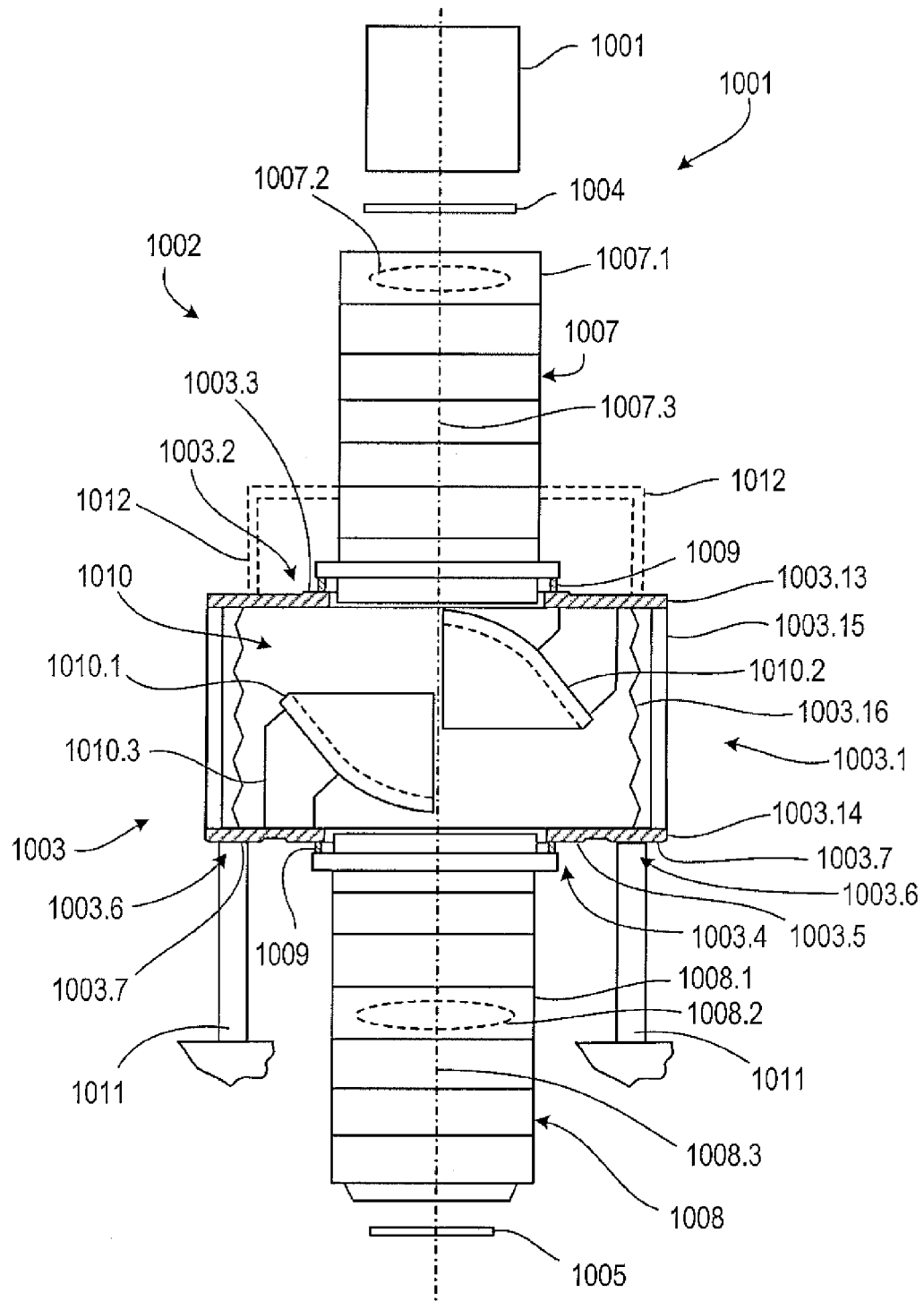
FIG. 11 is a schematic partially sectional view of a further preferred embodiment of an optical exposure apparatus according to the present invention comprising an optical projection system according to the present invention with a support unit according to the present invention.

In the following, a further preferred embodiment of an optical exposure apparatus 1001 according to the present invention comprising a catadioptric optical projection system 1002 according to the present invention with a support unit 1003 according to the present invention will be described with reference to FIG. 11. In its basic design and functionality, this embodiment does not differ from the embodiment described with reference to FIG. 1. Thus, like components have been designated with it the same reference numerals raised by 1000 and it is here mainly referred to the differences only.

The optical exposure apparatus 1001 is adapted to transfer an image of a pattern formed on a mask 1004 onto a substrate 1008. To this end, the optical exposure apparatus 1005 comprises an illumination system 1006 illuminating said mask and the optical projection system 1002. The optical projection system 1002 projects the image of the pattern formed on the mask 1004 onto the substrate 1005, e.g. a wafer or the like.

The optical projection system 1002 comprises two optical sub-systems in the form of two elongated lens units, namely a first lens unit in the form of a first lens unit 1007 and a second lens unit in the form of a second lens unit 1008 mounted to and supported by the support unit 1003.

The optical projection system 1002 receives the part of the light path between the mask 1004 and the substrate 1005. In particular, the first lens unit 1007 receives a first part of said light path while the second lens unit 1008 receives a second part of said light path. The support unit 1003 receives a third part of said light path located between the first lens unit 1007 and the second lens unit 1008.

Each lens unit 1007, 1008 comprises a stack of lens modules 1007.1 and 1008.1, respectively, connected to each other. Each of said lens modules 1007.1 and 1008.1, respectively, comprises a lens 1007.2 and 1008.2, respectively, as well as a support frame supporting said lens 1007.2 and 1008.2, respectively. The first lens unit has a first optical axis 1007.3, while the second lens unit 1008 has a second optical axis 1008.3.

At least some of the lenses 1007.2 and 1008.2, respectively, are actively positioned during operation of the exposure apparatus 1006 by means of active positioning devices controlled by a corresponding control device (not shown). To this end, the control device may receive information representative of the actual imaging quality provided by the optical projection system 1002 and control the operation of the active positioning devices of the respective lens module 1007.1 and 1008.1, respectively, in response to this information.

The support unit 1003 comprises a support part 1003.1 centrally arranged within the optical projection system 1002. This support part 1003.1 is of sufficient rigidity and strength to take the loads of the first lens unit 1007 and the second lens unit 1008. The support part 3.1 comprises an upper support plate 1003.13 and a lower support plate 1003.14. These support plates 1003.13 and 1003.14 are connected via a plurality of support struts 1003.15 evenly distributed at the circumference of the support part 1003.1. The connection may be provided by any suitable means. In particular, it may be provided as it is disclosed in DE 198 30 719 A1, the disclosure of which is incorporated herein by reference.

Furthermore, the support unit 1003 is optically functional. To this end, a separate enveloping part in the form of a bellows 1003.16 is mounted between the upper support plate 1003.13 and the and the lower support plate 1003.14. The bellows 1003.16 together with the upper support plate 1003.13 and the and the lower support plate 1003.14 forms a gas tight and light tight envelope of the part of the light path between the first lens unit 1007 and the second lens unit 1008. To provide said gas and light tightness, the first lens unit 1007 and the second lens unit 1008, both, are mounted to the support unit 1003 in a gas and light tight manner via coupling elements 1009 as disclosed in the German patent application No. 103 52 820.2, filed on Nov. 11, 2003, the disclosure of which is incorporated herein by reference. These coupling elements 1009 also provide for a thermal deformation decoupling of the support unit 1003 and the respective lens unit 1007, 1008. Thus, in other words, the support unit 1003 integrates the function of supporting the first lens unit 1007 and the second lens unit 1008 and the function of enveloping said third part of the light path between the latter in a gas tight and light tight manner.

A further optical sub-system 1010 forming the reflective part of the catadioptric optical projection system 1002 is located within the support unit 1003. This further optical sub-system is formed by two reflective elements in the form of mirrors 1010.1 and 1010.2. These mirrors 1010.1 and 1010.2 define the shape of the light path within the support unit 1003. Both mirrors 1010.1 and 1010.2 are mounted to the support unit 1003 by three suitable supports 1010.3 in a statically determinate way, namely in an isostatic manner.

It will be appreciated that, with other embodiments of the present invention, the mirrors may be mounted to mirror frames which are, in turn, mounted in a statically determinate way to the support unit. Furthermore, it will be appreciated that, with other embodiments of the present invention, one or both of the mirrors may be mounted to the support unit in a statically indeterminate way. For example, a statically overdeterminate mounting may be used to introduce defined deformations into the respective mirror.

The further optical sub-system 1010 forming the reflective part of the catadioptric optical projection system 1002 only comprises reflective optical elements. However, it will be appreciated that, with other embodiments of the present invention, the further optical sub-system located within the support unit may also comprise other optical elements, e.g. refractive optical elements such as lenses etc. or diffractive optical elements etc.

The upper support plate 1003.13 provides a first interface 1003.2 with a simple planar first interface surface 1003.3. This first interface 1003.2 forms a first support interface for the first lens unit 1007. The first interface 1003.2 also forms a first passage for the light path from the first lens unit 1007 to the support unit 1003.

At the lower side of the support unit 1003, opposite to the first interface 1003.2, the lower support plate 1003.14 provides a second interface 1003.4 with a simple planar second interface surface 1003.5. This second interface 1003.4 forms a second support interface for the second lens unit 1008. The second interface 1003.4 also forms a second passage for the light path from the support unit 1003 to the second lens unit 1008.

The first interface surface 1003.3 is parallel to the second interface surface 1003.5. Furthermore, the first optical axis 1007.3 of the first lens unit 1007 and the second optical axis 1008.3 of the second lens unit 1008 are adjusted to assume a predetermined positional relationship. This predetermined positional relationship may be any necessary positional relationship, e.g. parallel or inclined with respect to each other. In the embodiment shown, the first optical axis 1007.3 of the first lens unit 1007 the second optical axis 8.3 of the second lens unit 1008 are adjusted to be collinear as a special case of parallelism.

In the embodiment shown, the first interface has a first interface axis collinear with the first optical axis 1007.3. Furthermore, the second interface has a second interface axis collinear with the second optical axis 1008.3 and, thus, collinear with the first interface axis. However, it will be appreciated that, depending on the required geometry of the light path other alignments of the interface surfaces, the interface axes and the optical axes, respectively, may be provided by simple adjustments of the respective coupling between the lens unit and the support unit.

At its lower side, the support unit 1003 furthermore provides auxiliary interfaces 1003.6, each with a simple planar auxiliary interface surface 1003.7. Each auxiliary interface surface 1003.7 forms a rest interface for the support unit 1003. At each auxiliary interface 1003.7 the support unit 1003 and, thus, the optical projection system 1002 is coupled to a support element 1011 defining the position of the optical projection system 1002 in space. Each auxiliary interface surface 1003.7 also forms a reference interface for the support unit 1003.

The auxiliary interface surfaces 1003.7 are separated from but coplanar with the second interface surface 1003.5. Thus, all the interface surfaces 1003.5 and 1003.7 at the lower side of the support unit 1003 may be manufactured in one common step adding to the overall accuracy of the system. To avoid adverse run-on effects during manufacturing affecting the surface quality of the respective interface surface, the surfaces are provided with inclined ramps and/or overruns at their periphery.

Twelfth Embodiment

Figure 12:
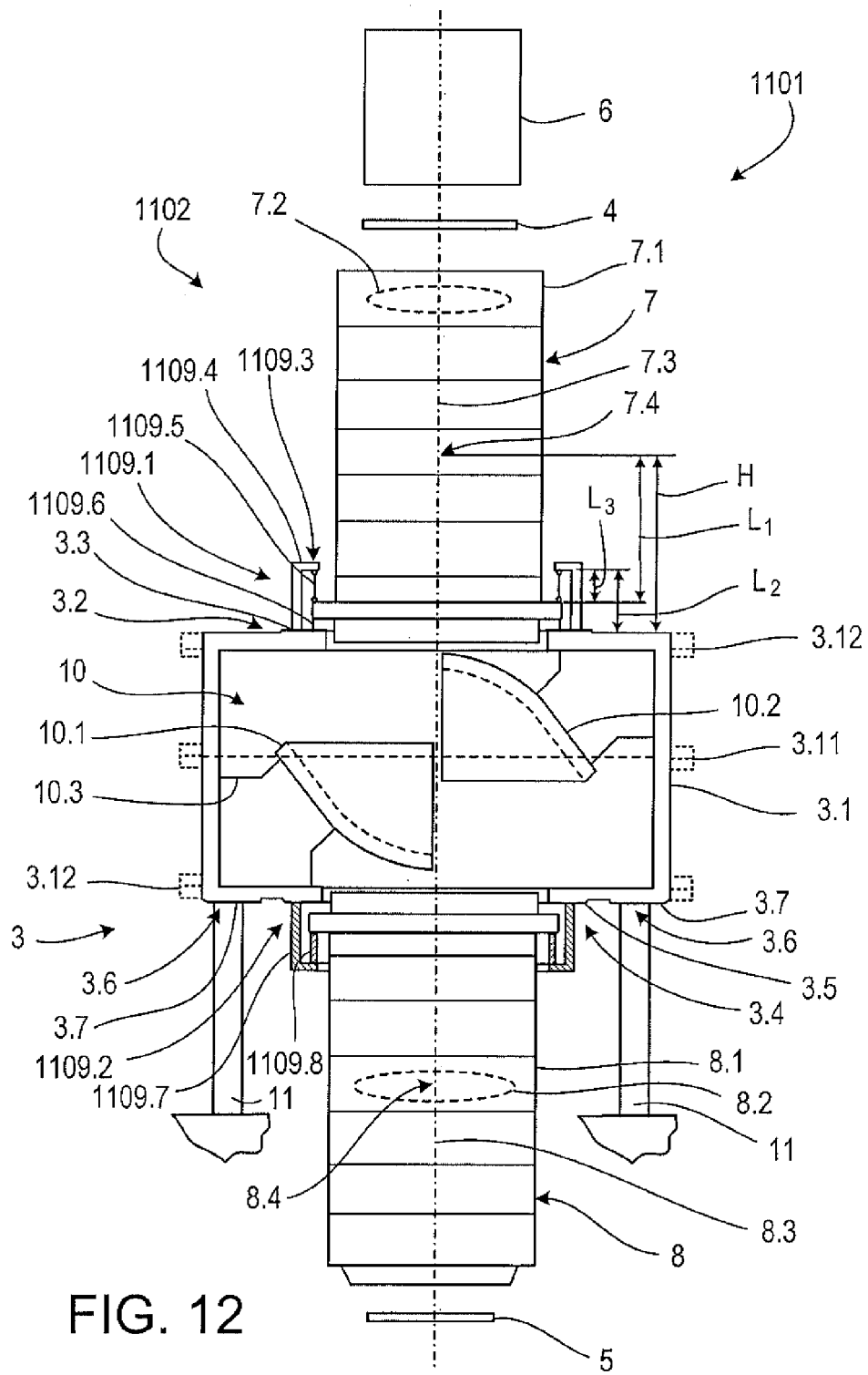
FIG. 12 is a schematic partially sectional view of a further preferred embodiment of an optical exposure apparatus according to the present invention comprising an optical projection system according to the present invention with a support unit according to the present invention.

In the following, a twelfth preferred embodiment of an optical exposure apparatus 1 according to the present invention comprising a catadioptric optical projection system 2 according to the present invention with a support unit 3 according to the present invention will be described with reference to FIG. 12. In its basic design and functionality, this embodiment does not differ from the embodiment described with reference to FIG. 1. In particular, the majority of the components of the optical exposure apparatus 1 is identical with the components of the optical exposure apparatus 1 of FIG. 1. Thus, in FIG. 12, components identical with the components of FIG. 1 have been designated with identical reference numerals and, with respect to these identical components it is here only referred to the explanation given above in the context of FIG. 1. As a consequence of this widely identical design it is here mainly referred to the differences only.

The difference with respect to the embodiment of FIG. 1 lies within the design of the coupling devices 1109.1 and 1109.2 by which the first lens unit 7 and the second lens unit 8 are respectively mounted to the housing 3.1. These coupling devices 1109.1 an 1109.2 provide for a thermal axial shift compensation along the optical axis 7.3 and 8.3 of the respective lens unit 7 and 8 with respect to the housing 3.1 as will be explained in the following.

The components of the first lens unit 7 and the second lens unit 8 forming the outer shell of the respective lens unit 7 and 8 are made of a first material that has a first coefficient of thermal expansion $\alpha_1$. The thermal expansion of these components occurring due to a raise in the temperature within these components, among others, would cause an axial shift between the points on the first lens unit 7 and the points on the second lens unit 8 along the optical axes 7.3 and 8.3 of the lens units 7 and 8 if the respective lens unit 7 and 8 was directly connected to the housing 3.1. The coupling devices 1109.1 and 1109.2 widely reduce or compensate for this thermal expansion effect by assuring that the center point 7.4 of the first lens unit 7 and the center point 8.4 of the second lens unit 8 upon thermal expansion substantially keep their axial distance with respect to the first interface surface 3.3 and the second interface surface 3.5, respectively.

To this end, the first coupling device 1109.1 is formed by a plurality of coupling units 1109.3 evenly distributed at the circumference of the first lens unit 7. Each coupling unit 1109.3 comprises a first coupling element 1109.4 and a second coupling element 1109.5. The first coupling element 1109.4, on its first end, is coupled to the first interface surface 3.3 of the first interface 3.2 and has a second coefficient of thermal expansion $\alpha_2$ different from the first coefficient of thermal expansion $\alpha_1$ of the first lens unit 7. The second coupling element 1109.5 is coupled with its first end to the second end of the first coupling element 1109.4. The second coupling element 1109.5, on its second end, is coupled to the first lens unit 7. The second coupling element 1109.5 has a third coefficient of thermal expansion $\alpha_3$ different from the first coefficient of thermal expansion $\alpha_1$ of the first lens unit 7 and the second coefficient of thermal expansion $\alpha_2$ of the first coupling element 1109.4.

With the dimension $L_1$ of the first lens unit 7, the dimension $L_2$ of the first coupling element 1109.4 and the dimension $L_3$ of the second coupling element 1109.5 given in FIG. 10, the axial height H of the center point 7.4 of the first lens unit 7 above the first interface surface 3.3 calculates as:

$$H = L_1 - L_3 + L_2. \tag{1}$$

As a function of the change in the temperature situation ΔT and the coefficient of thermal expansion of the respective component 7, 1109.4 and 1109.5, the variation ΔH in the height H of the center point 7.4 of the first lens unit 7 above the first interface surface 3.3 calculates as:

$$\Delta H(\Delta T; \alpha_1; \alpha_2; \alpha_3) = \Delta L_1(\Delta T; \alpha_1) - \Delta L_3(\Delta T; \alpha_3) + \Delta L_2(\Delta T; \alpha_2). \quad (2)$$

It will be appreciated that the coefficients of thermal expansion $\alpha_1$, $\alpha_2$ and $\alpha_3$ and the dimensions $L_1$, $L_2$ and $L_3$ may be selected such that the condition $$\Delta H(\Delta T; \alpha_1; \alpha_2; \alpha_3) = \Delta L_1(\Delta T; \alpha_1) - \Delta L_3(\Delta T; \alpha_3) + \Delta L_2(\Delta T; \alpha_2) = 0 \quad (3)$$

is substantially fulfilled.

As an example: when the change in the temperature situation $\Delta T$ is substantially equal for all components, with a reference dimension $L_{1R}$, a reference dimension $L_{2R}$ and a reference dimension $L_{3R}$ of the respective component, Equation (3) may be written as:

$$\Delta H = L_{1R} \cdot \alpha_1 - L_{3R} \cdot \alpha_3 + L_{2R} \cdot \alpha_2 = 0 \quad (3)$$

With $L_{2R} = x L_{1R}$ and $L_{3R} = y L_{1R}$ Equation (3) may be rewritten as:

$$\Delta H = L_{1R} \cdot \alpha_1 - y \cdot L_{1R} \cdot \alpha_3 + x \cdot L_{1R} \cdot \alpha_2 = 0. \quad (4)$$

Equation (4) may be resolved to provide:

$$y = \frac{\alpha_1}{\alpha_3} + x \cdot \frac{\alpha_2}{\alpha_3}. \quad (5)$$

Thus, it will be appreciated that, e.g. for a given material for the outer shell of the first lens unit 7, reasonable material combinations and dimensions for the first coupling element 1109.4 and the second coupling element 1109.5 may be found. For example, if the outer shell of the first lens unit 7 is made of steel, the first coupling element 1109.4 is made of Invar and the second coupling element 1109.5 is made of aluminum, i.e. with $\alpha_1 = 10 \cdot 10^{-6}$, $\alpha_2 = 1 \cdot 10^{-6}$ and $\alpha_3 = 24 \cdot 10^{-6}$, solutions of Equation (5) with practical dimensions are between about $x \approx y \approx 0.44$ and $x = 0.56$, $y = 0.44$.

The coupling between the first coupling element 1109.4 and the second coupling element 1109.5 as well as between the second coupling element 1109.5 and the first lens unit 7 may be of any suitable type. Preferably a coupling is selected that provides a radial thermal deformation decoupling. Furthermore, any suitable number of coupling units 1109.3 may be chosen. Preferably, three coupling units 1109.3 are evenly distributed at the circumference of the first lens unit 7.

The light and gas tight enclosure of the light path is provided by a bellows 1109.6 or any other suitably flexible but gas and light tight component.

The second coupling device 1109.2 is formed by a cylindrical first coupling element 1109.7 and a cylindrical second coupling element 1109.8. Both, the first coupling element 1109.7 and a second coupling element 1109.8 are arranged coaxially with the second lens unit 8.

The first coupling element 1109.7, on its first end, is coupled to the second interface surface 3.5 of the second interface 3.4 and has a second coefficient of thermal expansion $\alpha_2$ different from the first coefficient of thermal expansion $\alpha_1$ of the second lens unit 8. The second coupling element 1109.8 is coupled with its first end to the second end of the first coupling element 1109.7. The second coupling element 1109.8, on its second end, is coupled to the second lens unit 8. The second coupling element 1109.8 has a third coefficient of thermal expansion $\alpha_3$ different from the first coefficient of thermal expansion $\alpha_1$ of the second lens unit 8 and the second coefficient of thermal expansion $\alpha_2$ of the first coupling element 1109.7. Thus axial shift compensation may be achieved by suitably selecting the coefficients of thermal expansion and the dimensions of the first and second coupling element 1109.7 and 1109.8 in the same way as it has been described in the context of the first coupling device 1109.1.

The light and gas tight enclosure of the light path is provided by the first and second coupling element 1109.7 and 1109.8 being suitably connected in a light and gas tight manner. Of course, any other additional suitably light and gas tight enclosure may be chosen as well.

It will be appreciated that any other couple of points of the optical projection system 2 may be selected as the reference point and the point to kept at a constant distance form this reference point. Of course, compensation for the thermal expansion of the housing 3.1 may also be realized such that a constant distance is maintained between two points on the first lens unit 7 and the second lens unit 8 at any temperature situation. Furthermore, it will be appreciated that only one type of coupling device may be used in one optical projection system.

In the foregoing, the present invention has been described in the context of embodiments having a housing made of a ceramic material comprising SiC or having a housing made of steel, respectively. However, it will be appreciated that other variants of the invention may comprise a housing made another material, in particular made of another ceramic material, such as SiN or C/C—SiC, another metal or a metal alloy.

Finally, it is to be mentioned that the disclosure of all references cited hereinbefore is incorporated herein by reference. Insofar as a description of these references or a comment on these references is given, neither correctness nor completeness whatsoever is claimed.

What is claimed is:

1. An optical projection system for a microlithography system comprising
   a light path,
   a first lens unit receiving a first part of said light path,
   a second lens unit receiving a second part of said light path,
   a support unit supporting said first lens unit and said second lens unit;
   said first lens unit and said second lens unit being elongated lens units comprising a plurality of lenses;
   said support unit comprising a housing receiving a third part of said light path and enclosing at least one reflective element;
   said housing comprising at least a first interface and a second interface;
   said first interface being a first support interface supporting said first lens unit;
   said second interface being a second support interface supporting said second lens unit at a location substantially opposite to said first interface.

2. The optical projection system according to claim 1, wherein:
   said first interface includes a first passage for said light path;
   said second interface includes a second passage for said light path;
   said housing defines an envelope for said light path; and
   said envelope, apart from said first passage and said second passage, is essentially gas tight.

3. The optical projection system according to claim 1, wherein said at least one reflective element is adjustably held in said housing.

4. The optical projection system according to claim 1, wherein said at least one reflective element is selected from the group consisting of a prism, a beam splitter, an optical element defining a shape of said light path within said housing, and an optical element defining a part of an optical axis of said optical projection system.

5. The optical projection system according to claim 1, wherein said first lens unit has a first optical axis, and said second lens unit has a second optical axis which is collinear with said first optical axis or parallel to said first optical axis.

6. The optical projection system according to claim 1, further comprising a third lens unit, wherein said support unit is supporting said third lens unit.

7. The optical projection system according to claim 6, wherein said first lens unit has a first optical axis, and said third lens unit has a third optical axis which is inclined with respect to said first optical axis.

8. The optical projection system according to claim 6, wherein said third lens unit comprises a reflective element.

9. The optical projection system according to claim 1, wherein said supporting part comprises a plurality of support interfaces, and each support interface supports one of said lens units.

10. The optical projection system according to claim 1, wherein said supporting part is monolithic.

11. The optical projection system according to claim 1, wherein said supporting part is composed of a plurality of separate components.

12. The optical projection system according to claim 1, wherein said supporting part comprises a material having at least one property selected from the group consisting of a high modulus of elasticity, a high thermal conductivity, and a low thermal expansion coefficient.

13. The optical projection system according to claim 1, wherein said supporting part comprises a ceramic material.

14. The optical projection system according to claim 1, wherein said supporting part comprises SiC.

15. The optical projection system according to claim 1, wherein said supporting part comprises ceramically bonded sub-sections.

16. The optical projection system according to claim 1, wherein said supporting part is formed using at least one process selected from the group consisting of a low shrinkage near-net-shape casting process and a low shrinkage near-net-shape reaction infiltration process.

17. The optical projection system according to claim 1, wherein said first interface comprises an air bearing unit.

18. The optical projection system according to claim 1, further comprising a device configured to compensate a thermally induced shift between components of said optical projection system.

19. The optical projection system according to claim 1, wherein said first interface is configured to adjust said first optical element unit.

20. The optical projection system according to claim 1, wherein said second interface is configured to adjust said second optical element unit.

21. The optical projection system according to claim 1, wherein said support unit has at least an internal interface configured to support and adjust said at least one reflective element received within said support housing.

22. The optical projection system according to claim 2, wherein said envelope comprises a bellows.

23. An apparatus, comprising:
   an illumination system; and
   an optical projection system according to claim 1,
   wherein the apparatus is an optical exposure apparatus.

24. A method of operating an optical exposure apparatus comprising an illumination system and an optical projection system, the method comprising:
   using the illumination system to illuminate a pattern of a mask; and
   using the optical exposure apparatus to transfer an image of the illuminated pattern of the mask onto a substrate,
   wherein the optical projection system is an optical projection system according to claim 1.

* * * * *

UNITED STATES PATENT AND TRADEMARK OFFICE
CERTIFICATE OF CORRECTION

PATENT NO.         : 9,104,016 B2
APPLICATION NO.    : 13/626810
DATED              : August 11, 2015
INVENTOR(S)        : Johannes Rau et al.

Page 1 of 1

It is certified that error appears in the above-identified patent and that said Letters Patent is hereby corrected as shown below:

In the Specification

Col. 1, line 16, delete "international" and insert -- International --.

Col. 1, line 23, delete "ions" and insert -- lens --.

Col. 2, line 20, delete "system" and insert -- system. --.

Col. 12, line 32, delete "108.3" and insert -- 108.3. --.

Col. 13, line 24, delete "an a" and insert -- a --.

Col. 13, line 40, delete "208.3" and insert -- 208.3. --.

Signed and Sealed this
Twenty-first Day of June, 2016

Michelle K. Lee
*Director of the United States Patent and Trademark Office*